(12) United States Patent
Lin et al.

(10) Patent No.: US 9,812,194 B1
(45) Date of Patent: Nov. 7, 2017

(54) DECODING METHOD, MEMORY STORAGE DEVICE AND MEMORY CONTROL CIRCUIT UNIT

(71) Applicant: PHISON ELECTRONICS CORP., Miaoli (TW)

(72) Inventors: Wei Lin, Taipei (TW); Yu-Cheng Hsu, Yilan County (TW); Szu-Wei Chen, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/481,473

(22) Filed: Apr. 7, 2017

(30) Foreign Application Priority Data

Feb. 7, 2017 (TW) .............................. 106103993 A

(51) Int. Cl.
    *G11C 16/04* (2006.01)
    *G11C 11/56* (2006.01)
    *G11C 16/08* (2006.01)

(52) U.S. Cl.
    CPC ...... *G11C 11/5642* (2013.01); *G11C 11/5628* (2013.01); *G11C 16/0466* (2013.01); *G11C 16/08* (2013.01)

(58) Field of Classification Search
    CPC ............ G11C 11/5642; G11C 11/5628; G11C 16/0466; G11C 16/08; G11C 11/56; G11C 16/04

USPC ........... 365/185.03, 185.01, 189.19, 189.24, 365/189.2, 185.18
See application file for complete search history.

(56) References Cited

U.S. PATENT DOCUMENTS

| 8,320,735 | B2 * | 11/2012 | Tanaka ................. | G11B 27/329 386/235 |
| 8,559,789 | B2 * | 10/2013 | Tanaka ............. | G11B 20/00086 386/240 |
| 8,576,643 | B2 * | 11/2013 | Shinagawa ........... | G11C 16/06 365/185.01 |
| 2010/0220531 | A1 * | 9/2010 | Shinagawa ............ | G11C 16/06 365/185.24 |
| 2017/0139593 | A1 * | 5/2017 | Tan ......................... | G06F 3/061 |

\* cited by examiner

*Primary Examiner* — Gene Auduong
(74) *Attorney, Agent, or Firm* — JCIPRNET

(57) ABSTRACT

A decoding method for a rewritable non-volatile memory module is provided according to an exemplary embodiment of the disclosure. The method includes: obtaining usage state information of first memory cells; reading second memory cells by a first read voltage level to obtain at least one first bit and reading the second memory cells by a second read voltage level to obtain at least one second bit according to the usage state information, wherein the first bit corresponds to a storage state of a first part of memory cells among the second memory cells, the second bit corresponds to a storage state of a second part of memory cell among the second memory cells, and the first read voltage level is different from the second read voltage level; and decoding third bits including the first bit and the second bit. Therefore, a decoding efficiency can be improved.

30 Claims, 14 Drawing Sheets

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 106103993, filed on Feb. 7, 2017. The entirety of the above-mentioned patent application is hereby incorporated by reference herein and made a part of this specification.

BACKGROUND

1. Technology Field

The disclosure is directed to a decoding technique and more particularly, to a decoding method, a memory storage device and a memory control circuit unit.

2. Description of Related Art

Along with the rapid development of digital cameras, cell phones, and MP3 players in recently years, the consumers' demands for storage media have increased drastically. A rewritable non-volatile memory (e.g., a flash memory), provided with features such as data non-volatility, low power consumption, small volume, and non-mechanical structure, is adapted to be built in various portable multimedia devices exemplarily mentioned above.

Data exists in a form of charges in memory cells of the rewritable non-volatile memory module. During the use process of the rewritable non-volatile memory module, loss of the charges in the memory cells may occur due to a variety of factors and further result in reading errors in the memory cells. Thus, in some memory storage devices, data from a host system may be encoded and then stored. When the host system is to read the data, the encoded data is read and decoded to attempt to correct errors therein. Thereafter, only the data which is decoded and confirmed as correct is transmitted to the host system. However, in some situations, if too many errors exist in the read data, the data may not be successfully decoded. Particularly, if the rewritable non-volatile memory module includes a three-dimensional memory cell array, the loss of the charges in the memory cells may further be accelerated due to short distances among the memory cells.

Nothing herein should be construed as an admission of knowledge in the prior art of any portion of the disclosure. Furthermore, citation or identification of any document in this application is not an admission that such document is available as prior art to the disclosure, or that any reference forms a part of the common general knowledge in the art.

SUMMARY

Accordingly, the disclosure provides a decoding method, a memory storage device and a memory control circuit unit capable of improving decoding efficiency.

An exemplary embodiment of the disclosure provides a decoding method for a rewritable non-volatile memory module which includes a plurality of memory cells. The decoding method includes: obtaining usage state information of a plurality of first memory cells among the memory cells; according to the usage state information, reading a plurality of second memory cells among the memory cells by using a first read voltage level to obtain at least one first bit and reading the second memory cells by using a second read voltage level to obtain at least one second bit, wherein the at least one first bit corresponds to a storage state of a first part of memory cells among the second memory cells, the at least one second bit corresponds to a storage state of a second part of memory cells among the second memory cells, and the first read voltage level is different from the second read voltage level; and decoding a plurality of third bits including the at least one first bit and the at least one second bit.

Another exemplary embodiment of the disclosure provides a memory storage device including a connection interface unit, a rewritable non-volatile memory module and a memory control circuit unit. The connection interface unit is configured to couple to a host system. The rewritable non-volatile memory module includes a plurality of memory cells. The memory control circuit unit is coupled to the connection interface unit and the rewritable non-volatile memory module. The memory control circuit unit is configured to obtain usage state information of a plurality of first memory cells among the memory cells. The memory control circuit unit is further configured to send a first read command sequence to instruct to read a plurality of second memory cells among the memory cells by using a first read voltage level to obtain at least one first bit and send a second read command sequence to instruct to read the second memory cells by using a second read voltage level to obtain at least one second bit according to the usage state information. The at least one first bit corresponds to a storage state of a first part of memory cells among the second memory cells, the at least one second bit corresponds to a storage state of a second part of memory cells among the second memory cells, and the first read voltage level is different from the second read voltage level. The memory control circuit unit is further configured to decode a plurality of third bits including the at least one first bit and the at least one second bit.

Another exemplary embodiment of the disclosure provides a memory control circuit unit for controlling a rewritable non-volatile memory module which includes a plurality of memory cells. The memory control circuit unit includes a host interface, a memory interface, an error checking and correcting circuit and a memory management circuit. The host interface is configured to couple to a host system. The memory interface is configured to couple to the rewritable non-volatile memory module. The memory management circuit is coupled to the host interface, the memory interface and the error checking and correcting circuit. The memory management circuit is configured to obtain usage state information of a plurality of first memory cells among the memory cells. The memory management circuit is further configured to send a first read command sequence to instruct to read a plurality of second memory cells among the memory cells by using a first read voltage level to obtain at least one first bit and send a second read command sequence to instruct to read the second memory cells by using a second read voltage level to obtain at least one second bit according to the usage state information. The at least one first bit corresponds to a storage state of a first part of memory cells among the second memory cells, the at least one second bit corresponds to a storage state of a second part of memory cells among the second memory cells, and the first read voltage level is different from the second read voltage level. The error checking and correcting circuit is configured to decode a plurality of third bits including the at least one first bit and the at least one second bit.

Based on the above, when data is to be read from the second memory cells, a plurality of read voltage levels are used to read the memory cells according to the usage state of the first memory cells, so as to obtain the first bits and the second bits with higher accuracy. The first bits correspond to the storage state of a part of memory cells among the second memory cells, and the second bits correspond to the storage state of another part of memory cells among the second memory cells. Afterwards, the third bits including the first bits and the second bits can be decoded, so as to increase a decoding success rate.

It should be understood, however, that this Summary may not contain all of the aspects and embodiments of the disclosure, is not meant to be limiting or restrictive in any manner, and that the disclosure as disclosed herein is and will be understood by those of ordinary skill in the art to encompass obvious improvements and modifications thereto.

In order to make the aforementioned and other features and advantages of the disclosure more comprehensible, several embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
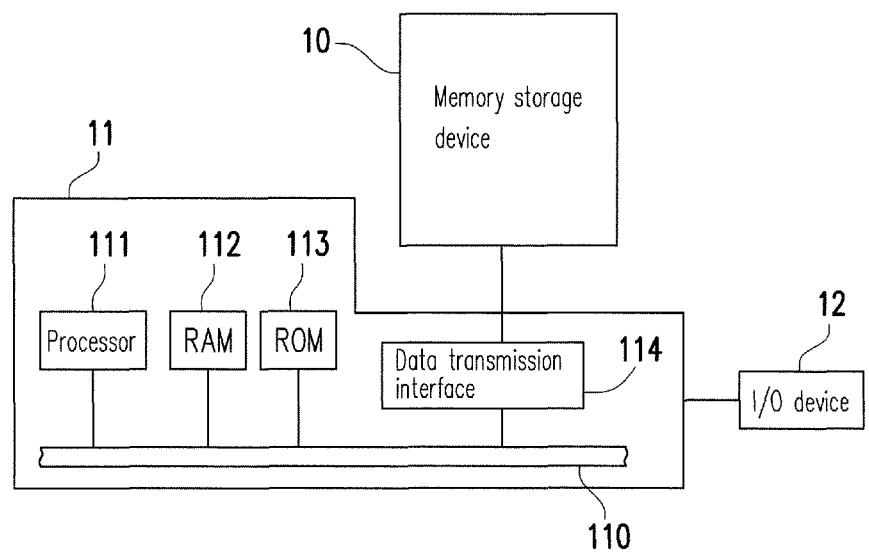
FIG. 1 is a schematic diagram illustrating a host system, a memory storage device and an input/output (I/O) device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) includes a rewritable non-volatile memory module and a controller (also known as a control circuit). The memory storage device is usually used together with a host system so that the host system may write data into the memory storage device or read data from the memory storage device.

Figure 2:
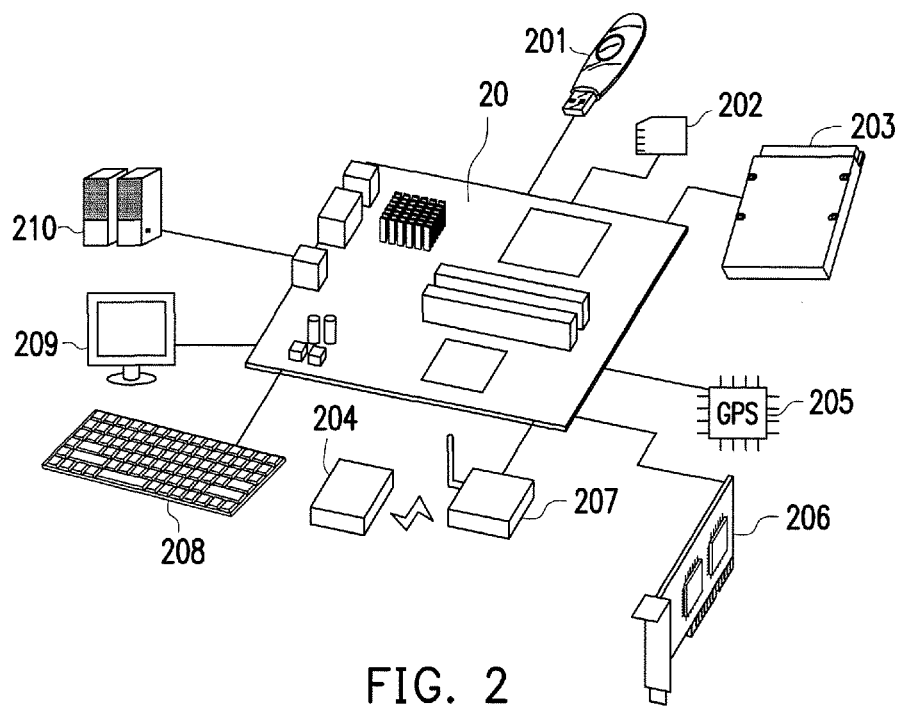
FIG. 2 is a schematic diagram illustrating a host system, a memory storage device and an I/O device according to another exemplary embodiment of the disclosure.

FIG. 1 is a schematic diagram illustrating a host system, a memory storage device and an input/output (I/O) device according to an exemplary embodiment of the disclosure. FIG. 2 is a schematic diagram illustrating a host system, a memory storage device and an I/O device according to another exemplary embodiment of the disclosure.

Referring to FIG. 1 and FIG. 2, a host system 11 generally includes a processor 111, a random access memory (RAM) 112, a read only memory (ROM) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 may store data into the memory storage device 10 or read data from the memory storage device 10 through the data transmission interface 114. Further, the host system 11 is coupled to an I/O device 12 through the system bus 110. For example, the host system 11 may transmit output signals to the I/O device 12 or receive input signals from I/O device 12 through the system bus 110.

In the present exemplary embodiment, the processor 111, the RAM 112, the ROM 113 and the data transmission interface 114 may be disposed on a main board 20 of the host system 11. An amount of the data transmission interface 114 may be one or a plurality. Through the data transmission interface 114, the main board 20 may be coupled to the memory storage device 10 in a wired manner or a wireless manner. The memory storage device 10 may be, for example, a flash drive 201, a memory card 202, a solid state drive (SSD) 203 or a wireless memory storage device 204. The wireless memory storage device 204 may be, for example, a memory storage device based on various wireless communication technologies, such as a near field communication (NFC) memory storage device, a wireless fidelity (WiFi) memory storage device, a Bluetooth memory storage device or a Bluetooth low energy (BLE) memory storage device (e.g., iBeacon). Further, the main board 20 may also be coupled to various I/O devices, including a global positioning system (GPS) module 205, a network interface card 206, a wireless transmission device 207, a keyboard 208, a monitor 209 and a speaker 210, through the system bus 110. For example, in an exemplary embodiment, the main board 20 can access the wireless memory storage device 204 through the wireless transmission device 207.

Figure 3:
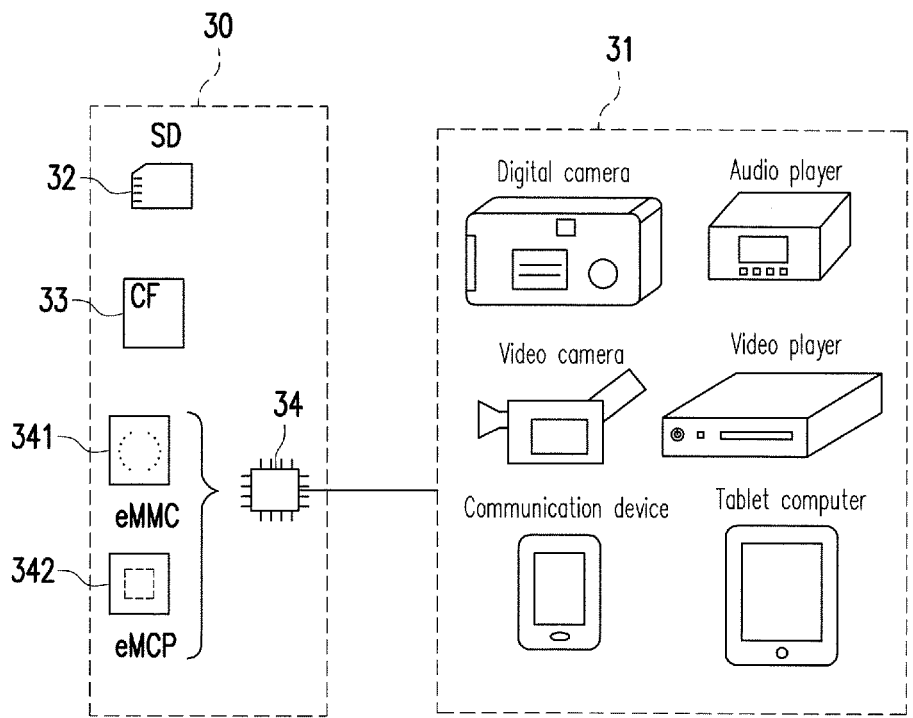
FIG. 3 is a schematic diagram illustrating a host system and a memory storage device according to another exemplary embodiment of the disclosure.

In an exemplary embodiment, the aforementioned host system may be any system capable of substantially cooperating with the memory storage device for storing data. Although the host system is illustrated as a computer system in the foregoing exemplary embodiment, FIG. 3 is a schematic diagram illustrating a host system and a memory storage device according to another exemplary embodiment of the disclosure. Referring to FIG. 3, in another exemplary embodiment, a host system 31 may also be a system, such as a digital camera, a video camera, a communication device, an audio player, a video player or a tablet computer, whereas a memory storage device 30 can be any memory device used by the host system 31, such as a secure digital (SD) card 32, a compact flash (CF) card 33 or an embedded storage device 34. The embedded storage device 34 includes various embedded storage devices capable of being directly coupling a memory module onto a substrate of the host system, such as an embedded multi media card (eMMC) 341 and/or an embedded multi chip package (eMCP) storage device 342.

Figure 4:
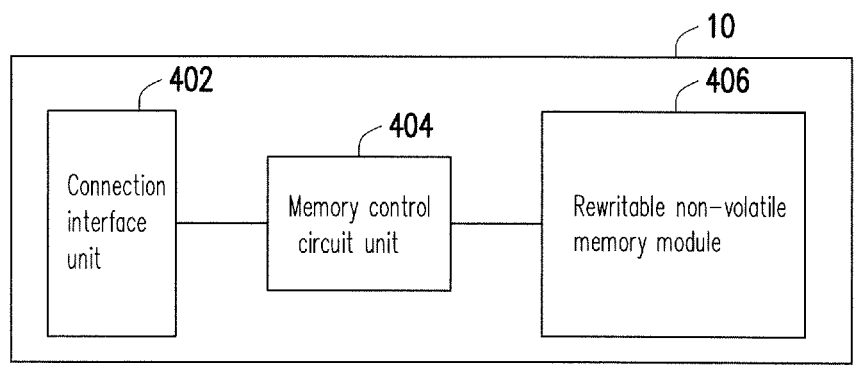
FIG. 4 is a schematic block diagram illustrating a memory storage device according to an exemplary embodiment of the disclosure.

FIG. 4 is a schematic block diagram illustrating the memory storage device according to an exemplary embodiment of the disclosure.

Referring to FIG. 4, the memory storage device 10 includes a connection interface unit 402, a memory control circuit unit 404 and a rewritable non-volatile memory module 406.

The connection interface unit 402 is configured to couple the memory storage device 10 to the host system 11. In the present exemplary embodiment, the connection interface unit 402 is compatible with a serial advanced technology attachment (SATA) standard. However, it should be understood that the disclosure is not limited thereto. The connection interface unit 402 may also be compatible to a parallel advanced technology attachment (PATA) standard, an Institute of Electrical and Electronic Engineers (IEEE) 1394 standard, a peripheral component interconnect express (PCI Express) standard, a universal serial bus (USB) standard, an secure digital (SD) interface standard, an ultra high speed-I (UHS-I) interface standard, an ultra high speed-II (UHS-II) interface standard, a memory stick (MS) interface standard, an MCP interface standard, a multi media card (MMC) interface standard, an embedded multimedia card (eMMC) interface standard, a universal flash storage (UFS) interface standard, an embedded multi chip package (eMCP) interface standard, a compact flash (CF) interface standard, an integrated device electronics (IDE) standard or other suitable standards. The connection interface unit 402 and the memory control circuit unit 404 may be packaged in one chip, or the connection interface unit 402 may be laid out outside a chip including the memory control circuit unit 404.

The memory control circuit unit 404 is configured to execute a plurality of logic gates or control commands which are implemented in a hardware form or in a firmware form and perform operations of writing, reading or erasing data in the rewritable non-volatile memory module 406 according to the commands of the host system 11.

The rewritable non-volatile memory module 406 is coupled to the memory control circuit unit 404 and configured to store data written by the host system 11. The rewritable non-volatile memory module 406 may be a single level cell (SLC) NAND flash memory module (i.e., a flash memory module capable of storing one bit in one memory cell), a multi level cell (MLC) NAND flash memory module (i.e., a flash memory module capable of storing two bits in one memory cell), a triple level cell (TLC) NAND flash memory module (i.e., a flash memory module capable of storing three bits in one memory cell), other flash memory modules or any memory module having the same features.

Each of the memory cells in the rewritable non-volatile memory module 406 stores one or more bits based on a voltage (hereinafter, also known as a threshold voltage) change. More specifically, in each of the memory cells, a charge trapping layer is provided between a control gate and a channel. An amount of electrons in the charge trapping layer may be changed by applying a write voltage to the control gate, thereby changing the threshold voltage of the memory cell. This process of changing the threshold voltage of a memory cell is also known as "writing data into the memory cell" or "programming the memory cell". With changes in the threshold voltage, each of the memory cells in the rewritable non-volatile memory module 406 has a plurality of storage states. The storage state to which the memory cell belongs may be determined by applying a read voltage, so as to obtain the one or more bits stored in the memory cell.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more physical programming units. If each of the memory cells can store two or more bits, the physical programming units on the same word line may be at least classified into a lower physical programming unit and an upper physical programming unit. For example, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In the present exemplary embodiment, the physical programming unit is the smallest unit for programming. That is, the physical programming unit is the smallest unit for writing data. For example, the physical programming unit is a physical page or a physical sector. If the physical programming unit is the physical page, the physical programming unit usually include a data bit area and a redundancy bit area. The data bit area includes multiple physical sectors configured to store user data, and the redundant bit area is configured to store system data (e.g., management data such as an error correcting code). In the present exemplary embodiment, the data bit area contains 32 physical sectors, and a size of each physical sector is 512 bytes (B). However, in other exemplary embodiments, the data bit area may also include 8, 16 physical sectors or more or fewer physical sectors, and the size of each physical sector may also be greater or smaller. On the other hand, the physical erasing unit is the smallest unit for erasing. Namely, each physical erasing unit contains the least number of memory cells to be erased together. For instance, the physical erasing unit is a physical block.

In the present exemplary embodiment, the memory cells are configured in a three-dimensional array in the rewritable non-volatile memory module 406. In another exemplary embodiment, the memory cells are configured in a two-dimensional array in the rewritable non-volatile memory module 406.

Figure 5A:
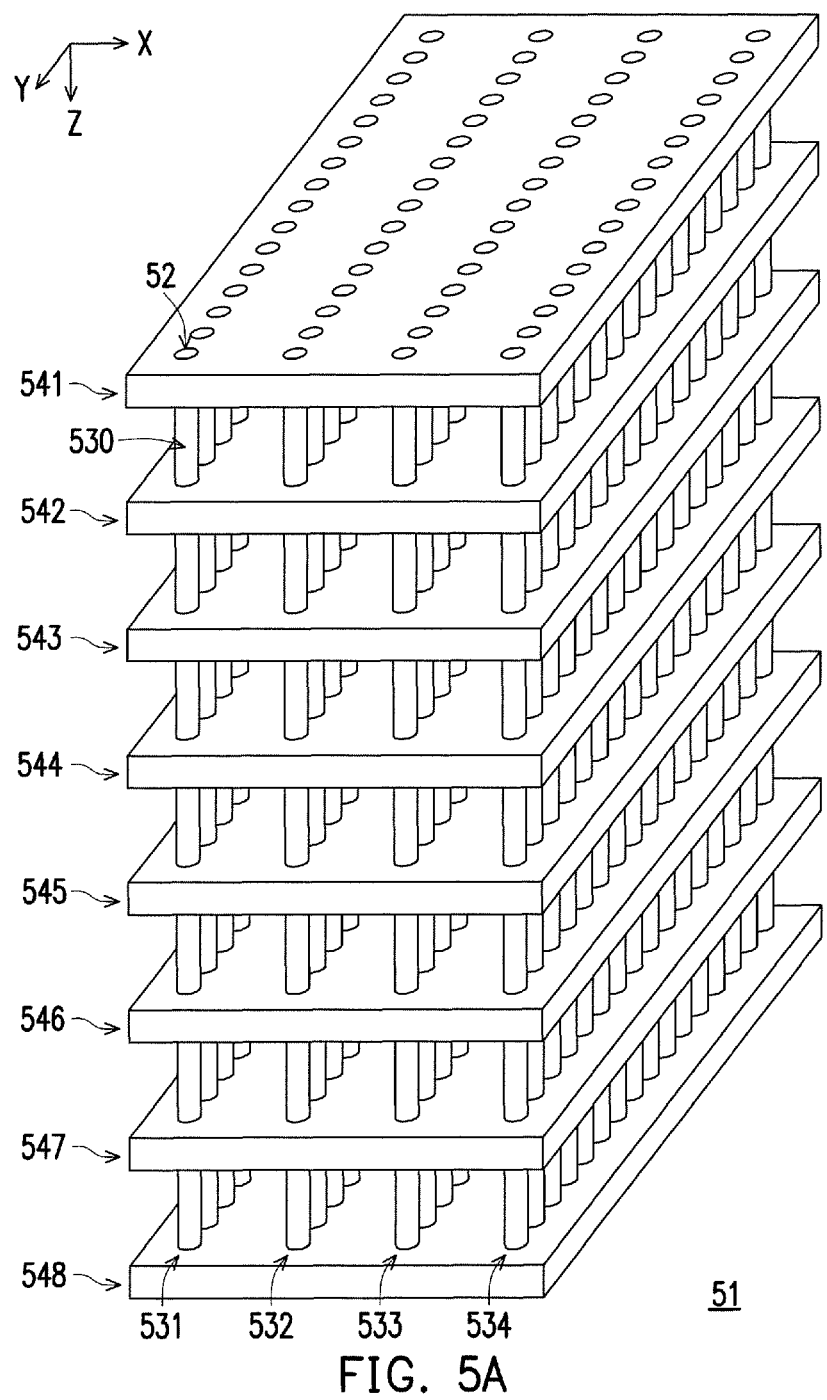
FIG. 5A is a schematic diagram illustrating a memory cell array according to an exemplary embodiment of the disclosure.

FIG. 5A is a schematic diagram illustrating a memory cell array according to an exemplary embodiment of the disclosure.

Referring to FIG. 5A, a memory cell array 51 includes a plurality of memory cells 52 used to store data, a plurality of bit line sets 531 to 534 and a plurality of word line layers 541 to 548. The bit line sets 531 to 534 are independent of one another (for example, separated from one another) and arranged along a first direction (e.g., the X axis). Each of the bit line sets 531 to 534 includes a plurality of bit lines 530 arranged independently of one another (for example, separately from one another). The bit lines 530 contained in each of the bit line sets are arranged along a second direction (e.g., the Y axis) and extend toward a third direction (e.g., the Z axis). The word line layers 541 to 548 are independent of one another (for example, separated from one another) and stacked along the third direction.

In the present exemplary embodiment, each of the word line layers 541 to 548 may be regarded as one word line plane. Each of the memory cells 52 is disposed at each intersection of each of the bit lines 530 in the bit line sets 531 to 534 and the word line layers 541 to 548. It should be noted that the memory cell array 51 illustrated in FIG. 5A is only an example, and in other exemplary embodiments that are not mentioned, total numbers of the memory cells 52, the bit line sets 531 to 534 and the word line layers 541 to 548 may be different. Additionally, in another exemplary embodiment, one bit line set may include more or fewer bit lines, and one word line layer may also allow more or fewer bit line sets to pass through.

Figure 5B:
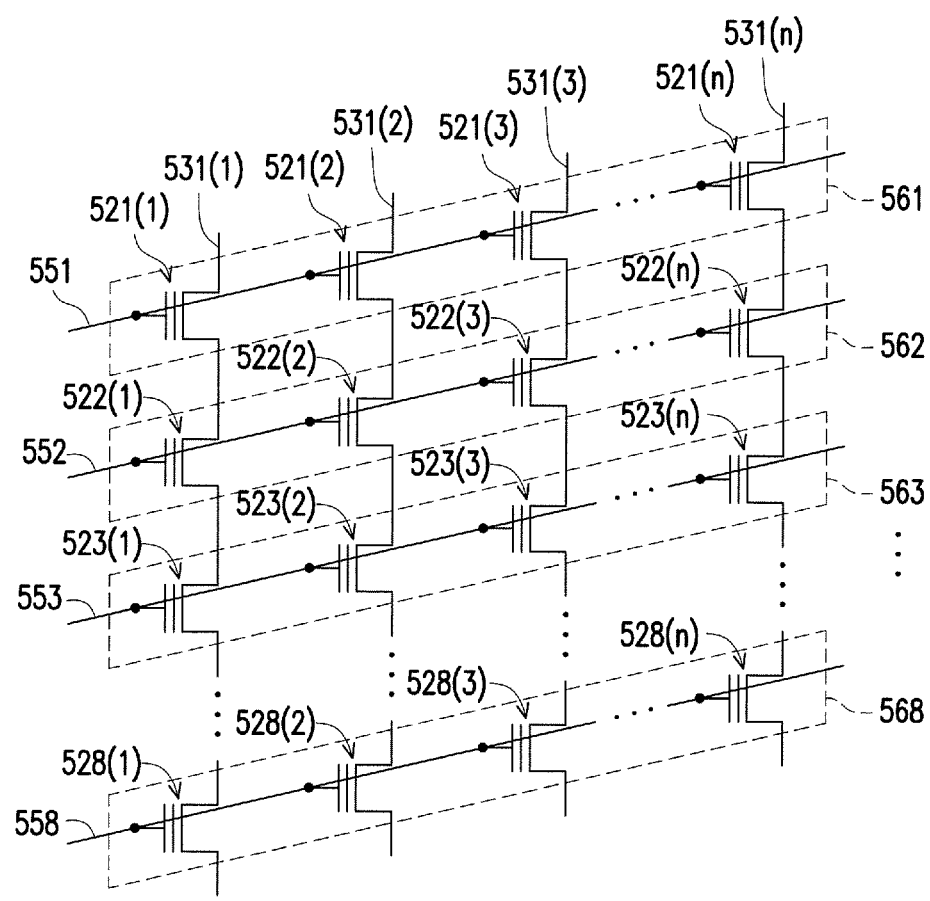
FIG. 5B is a schematic diagram illustrating an equivalent circuit of the memory cell array according to an exemplary embodiment of the disclosure.

FIG. 5B is a schematic diagram illustrating an equivalent circuit of the memory cell array according to an exemplary embodiment of the disclosure.

Referring to FIG. 5A and FIG. 5B, transistor units 521(1) to 521(n) are located at the word line layer 541. Transistor units 522(1) to 522(n) are located at the word line layer 542. Transistor units 523(1) to 523(n) are located at the word line layer 543. Transistor units 528(1) to 528(n) are located at the word line layer 548. One transistor unit may be equivalent to one memory cell. The bit line set 531 includes bit lines 531(1) to 531(n). The bit line 531(1) serially connects the transistor units 521(1), 522(1), 523(1) . . . and 528(1). The bit line 531(2) serially connects the transistor units 521(2), 522(2), 523(2) . . . and 528(2). The bit line 531(3) serially connects the transistor units 521(3), 522(3), 523(3) . . . and 528(3). The bit line 531(n) serially connects the transistor units 521(n), 522(n), 523(n) . . . and 528(n).

A word line 551 is located at the word line layer 541. A word line 552 is located at the word line layer 542. A word line 553 is located at the word line layer 543. A word line 558 is located at the word line layer 548. The word line 551 serially connects the transistor units 521(1) to 521(n). The word line 552 serially connects the transistor units 522(1) to 522(n). The word line 553 serially connects the transistor units 523(1) to 523(n). The word line 558 serially connects the transistor units 528(1) to 528(n). It should be noted that FIG. 5B only illustrates a part of components of each word line layer depicted in FIG. 5A, and the other parts that are not shown may be so inferred by analogy.

In the present exemplary embodiment, a total number of the transistor units serially connected by the same word line is equal to a total number of the memory cells contained in a physical unit. For example, the transistor units 521(1) to 521(n) are contained in a physical unit 561, the transistor units 522(1) to 522(n) are contained in a physical unit 562, the transistor units 523(1) to 523(n) are contained in a physical unit 563, and the transistor units 528(1) to 528(n) are contained in a physical unit 568. Taking the physical unit 561 as an example, when data stored in the physical unit 561 is to be read, storage states of the transistor units 521(1) to 521(n) may be simultaneously read. In addition, when data is to be stored into the physical unit 561, the transistor units 521(1) to 521(n) may be simultaneously programmed. In an exemplary embodiment, a total number of the memory cells contained in each of the physical units 561 to 568 is equal to a total number of the memory cells contained in one physical programming unit.

Figure 6:
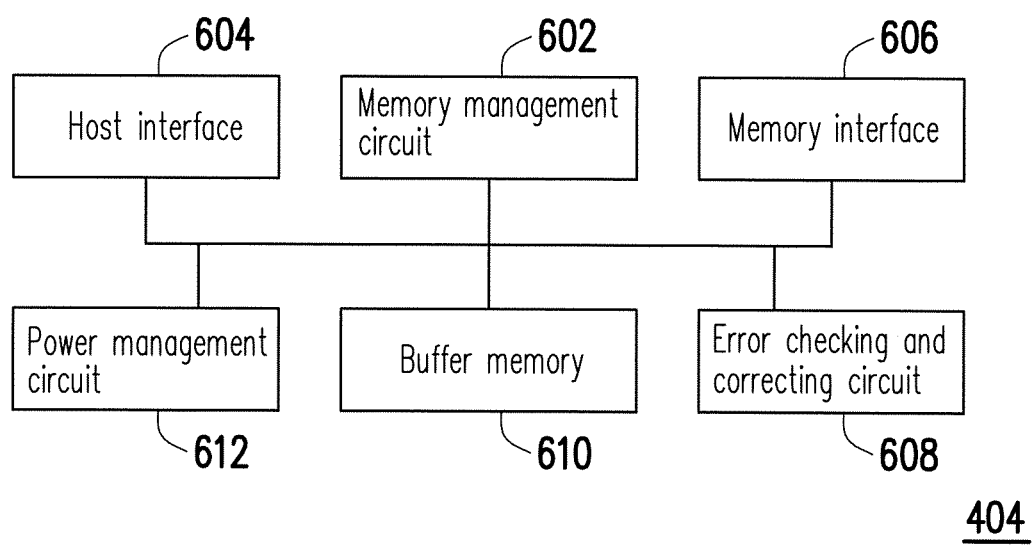
FIG. 6 is a schematic block diagram illustrating the memory control circuit unit according to an exemplary embodiment of the disclosure.

FIG. 6 is a schematic block diagram illustrating the memory control circuit unit according to an exemplary embodiment of the disclosure.

Referring to FIG. 6, the memory control circuit unit 404 includes a memory management circuit 602, a host interface 604 and a memory interface 606.

The memory management circuit 602 is configured to control overall operations of the memory control circuit unit 404. Specifically, the memory management circuit 602 has a plurality of control commands, and during the operation of the memory storage device 10, the control commands are executed to perform various operations, such as writing, reading and erasing data. Hereinafter, description regarding the operation of the memory management circuit 602 is equivalent to description regarding the operation of the memory control circuit unit 404.

In the present exemplary embodiment, the control commands of the memory management circuit 602 are implemented in a firmware form. For instance, the memory management circuit 602 has a microprocessor unit (not illustrated) and an ROM (not illustrated), and the control commands are burned into the ROM. When the memory storage device 10 is in operation, the control commands are executed by the microprocessor to perform operations of writing, reading or erasing data.

In another exemplary embodiment, the control commands of the memory management circuit 602 may also be stored as program codes in a specific area (for example, a system area in a memory module dedicated for storing the system data) of the rewritable non-volatile memory module 406. In addition, the memory management circuit 602 has a microprocessor unit (not illustrated), an ROM (not illustrated) and an RAM (not illustrated). More particularly, the ROM has a boot code, which is executed by the microprocessor unit to load the control commands stored in the rewritable non-volatile memory module 406 to the RAM of the memory management circuit 602 when the memory control circuit unit 404 is enabled. Thereafter, the control commands are executed by the microprocessor unit to perform operations of writing, reading or erasing data.

Further, in another exemplary embodiment, the control commands of the memory management circuit 602 may also be implemented in a hardware form. For example, the memory management circuit 602 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to issue a write command sequence to the rewritable non-volatile memory module 406 in order to write data into the rewritable non-volatile memory module 406. The memory reading circuit is configured to issue a read command sequence to the rewritable non-volatile memory module 406 in order to read data from the rewritable non-volatile memory module 406. The memory erasing circuit is configured to issue an erase command sequence to the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes and is configured to instruct the rewritable non-volatile memory module 406 to perform the corresponding operations, such as writing, reading and erasing. In an exemplary embodiment, the memory management circuit 602 may further issue command sequences of other types to the rewritable non-volatile memory module 406 for instructing to perform the corresponding operations.

The host interface 604 is coupled to the memory management circuit 602 and configured to receive and identify commands and data transmitted from the host system 11. In other words, the commands and data transmitted from the host system 11 are passed to the memory management circuit 602 through the host interface 604. In the present exemplary embodiment, the host interface 604 is compatible with the SATA standard. However, it should be understood that the disclosure is not limited thereto, and the host interface 604 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 606 is coupled to the memory management circuit 602 and configured to access the rewritable non-volatile memory module 406. That is, data to be written into the rewritable non-volatile memory module 406 is converted into a format acceptable by the rewritable non-volatile memory module 406 through the memory interface 606. Specifically, if the memory management circuit 602 is to access the rewritable non-volatile memory module 406, the memory interface 606 sends corresponding command sequences. For example, the command sequences may include a write command sequence which instructs to write data, a read command sequence which instructs to read data, an erase command sequence which instructs to erase data, and other corresponding command sequences configured to instruct to perform various memory operations (e.g., changing read voltage levels or performing a garbage collection procedure). These command sequences are, for example, generated by the memory management circuit 602 and transmitted to the rewritable non-volatile memory module 406 through the memory interface 606. The command sequences may include one or more signals, or data stored in the bus. The signals or the data may include command codes and programming codes. For example, in a read command sequence, information, such as identification codes and memory addresses, are included.

In an exemplary embodiment, the memory control circuit unit 404 further includes an error checking and correcting circuit 608, a buffer memory 610 and a power management circuit 612.

The error checking and correcting circuit 608 is coupled to the memory management circuit 602 and configured to perform an error checking and correcting operation to ensure data accuracy. Specifically, when the memory management circuit 602 receives a write command from the host system 11, the error checking and correcting circuit 608 generates an error correcting code (ECC) and/or an error detecting code (EDC) for data corresponding to the write command, and the memory management circuit 602 writes the data corresponding to the write command and the corresponding ECC and/or EDC into the rewritable non-volatile memory module 406. Thereafter, the memory management circuit 602 reads the ECC and/or the EDC corresponding to the data while reading the data from the rewritable non-volatile memory module 406, and the error checking and correcting circuit 608 performs the error checking and correcting operation on the read data according to the ECC and/or the EDC.

In the present exemplary embodiment, the error checking and correcting circuit 608 uses a low density parity check code (LDPC code). However, in another exemplary embodiment, the error checking and correcting circuit 608 may also use various encoding/decoding algorithms, such as a BCH code, a convolutional code, a turbo code, a bit flipping and so on.

The buffer memory 610 is coupled to the memory management circuit 602 and configured to temporarily store data and commands from the host system 11 or data from the rewritable non-volatile memory module 406. The power management circuit 612 is coupled to the memory management circuit 602 and configured to control power of the memory storage device 10.

In the present exemplary embodiment, the memory management circuit 602 may configure logical units for being mapped to the physical units in the rewritable non-volatile memory module 406. In the present exemplary embodiment, a physical unit refers to a physical programming unit, and a logical unit may refer to a logical address, a logical programming unit, a logical erasing unit or may be composed of a plurality of continuous or discontinuous logical addresses. In addition, a logical unit may be mapped to one or a plurality of physical units. For example, the memory management circuit 602 may record a mapping relationship (which is also referred to as a logical-to-physical relationship) between the logical units and the physical units in at least one logical-to-physical mapping table. When the host system 11 is to read data from the memory storage device 10 or write data into the memory storage device 10, the memory management circuit 602 may access data in the memory storage device 10 according to the logical-to-physical mapping table.

It is noted that in the following description, some terms may be replaced with corresponding abbreviations for ease of reading (see Table 1).

TABLE 1

| | |
|---|---|
| logical-to-physical mapping table | L2P table |
| physical-to-logical mapping table | P2L table |
| rewritable non-volatile memory module | RNVM module |
| physical unit | PU |
| physical erasing unit | PEU |
| physical programming unit | PPU |
| logical unit | LU |
| logical erasing unit | LEU |
| logical programming unit | LPU |
| memory management circuit | MMC |
| memory control circuit unit | MCCU |
| error checking and correcting circuit | ECCC |
| read voltage level | RVL |

Figure 7:
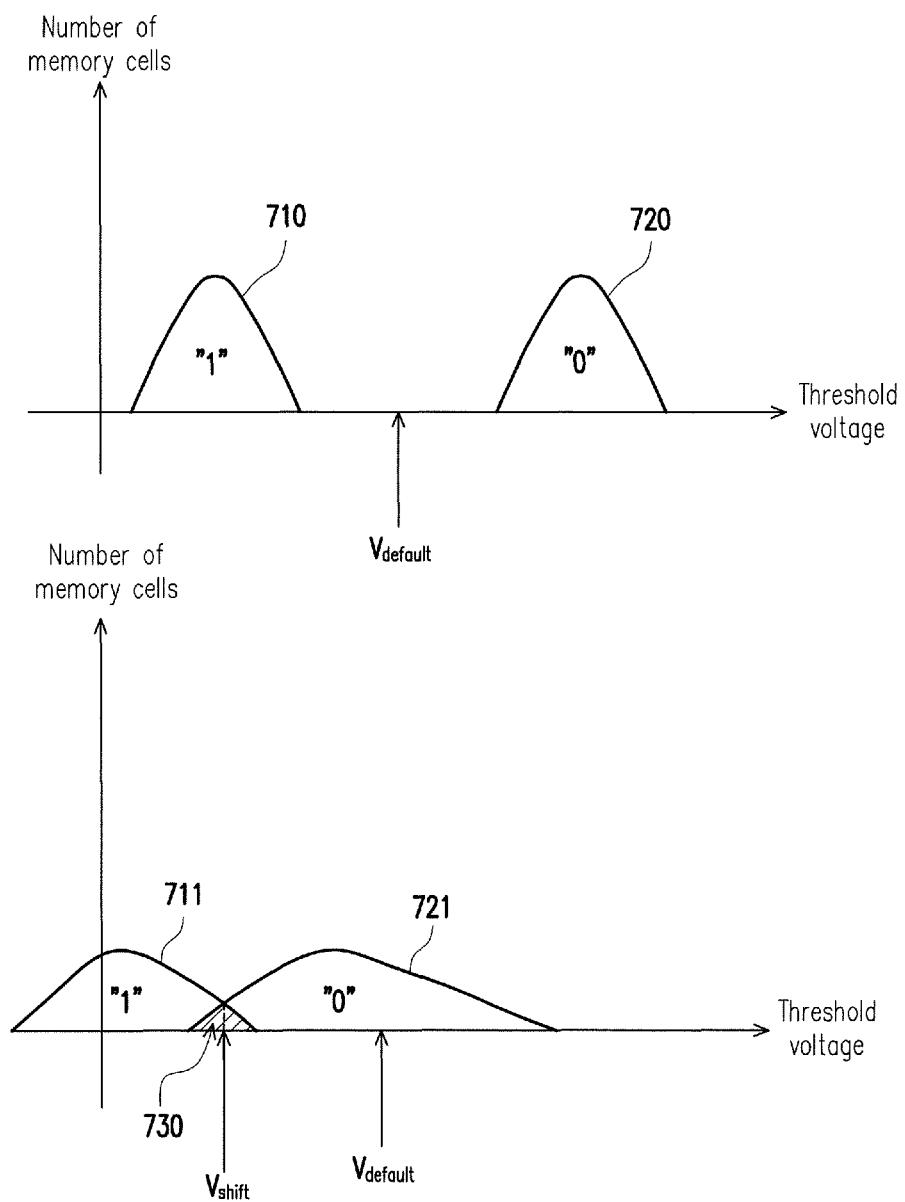
FIG. 7 is a schematic diagram illustrating threshold voltage distributions of memory cells according to an exemplary embodiment of the disclosure.

FIG. 7 is a schematic diagram illustrating threshold voltage distributions of memory cells according to an exemplary embodiment of the disclosure. It should be noted that FIG. 7 illustrates a threshold voltage distribution of the programmed memory cells after a certain PU of the RNVM module 406 is programmed, wherein the horizontal axis represents threshold voltages of the memory cells, and the vertical axis represents the number of the memory cells.

Referring to FIG. 7, if a threshold voltage of a certain memory cell belongs to a state 710, a bit stored by the memory cell is "1"; otherwise, if a threshold voltage of a certain memory cell belongs to a state 720, a bit stored by the memory cells is "0". It should be noted that in the present exemplary embodiment, each of the memory cells is configured to store one bit (for example, a bit "0" or a bit "1"), and thus, a threshold voltage distribution includes two states. In the following exemplary embodiments that will be described below, each of the memory cells storing one bit serves as an example. However, in other exemplary embodiments which are not mentioned to, if a memory cell is configured to store a plurality of bits, there may be four, eight, or any other number of possible states of the corresponding threshold voltages. In addition, the bit represented by each state on the threshold voltage distribution is not limited in the disclosure.

When data is to be read from a corresponding PU illustrated in FIG. 7, the MMC 602 sends a read command sequence to the RNVM module 406 to instruct the RNVM module 406 to read the PU by using a specific RVL (e.g., a read voltage $V_{default}$). Then, the RNVM module 406 transmits corresponding bit data to the MMC 602. For example, if a threshold voltage of a specific memory cell is lower than the read voltage $V_{default}$ (e.g., a memory cell belonging to the state 710), the MMC 602 reads a bit "1"; otherwise, if a threshold voltage of a specific memory cell is higher than the read voltage $V_{default}$ (e.g., a memory cell belonging to the state 720), the MMC 602 reads a bit "0". For example, the read voltage $V_{default}$ is a predetermined RVL of the corresponding PU illustrated in FIG. 7.

However, with increases in the usage time and/or changes in an operation environment of the RNVM module 406, a performance degradation may occur to the memory cells. After the performance degradation occurs, the states 710 and 720 may gradually get close to each other or even overlap with each other. Moreover, the states 710 and 720 may also become flatter. For example, states 711 and 721 are used to represent threshold voltage distributions of the memory cells after the occurrence of the performance degradation. After the occurrence of the performance degradation, if the read voltage $V_{default}$ is still used to read the memory cells, many memory cells actually storing bit "0" (which are the memory cells belonging to the state 721 but having threshold voltages less than the read voltage $V_{default}$) will be misjudged as memory cells storing bit "1", and/or many memory cells actually storing bit "1" (which are the memory cells belonging to the state 711 but having threshold voltages greater than the read voltage $V_{default}$) will be misjudged as memory cells storing bit "0". In other words, in correspondence to the states 711 and 721, if the memory cells are consistently read based on the read voltage $V_{default}$, the obtained data may include many errors (i.e., error bits). For example, as an area of an overlapping area 730 (marked with slashes) increases, the read errors may increase. If certain data include too many errors, the ECCC 608 may fail to successfully decode this data.

In an exemplary embodiment, in correspondence to the states 711 and 721, the MMC 602 may determine another RVL (e.g., a read voltage $V_{shift}$) and instruct the RNVM module 406 to reread the PU by using the RVL. According to FIG. 7, reading the memory cells corresponding to the states 711 and 721 by using the read voltage $V_{shift}$ may contribute to effectively reducing errors in the obtained data. In an exemplary embodiment, the read voltage $V_{shift}$ is an optimal read voltage corresponding to the states 711 and 721, which is obtained through performing an optimal read voltage tracking operation. However, in some situations, if a threshold voltage distribution of the memory cells shifts seriously, a decoding failure may still occur due to too many errors included in the read data even though a specific PU is read by using an optimal read voltage corresponding to this PU.

It should be noted that if the RNVM module 406 includes a three-dimensional memory cell array (as illustrated in FIG. 5A and FIG. 5B), charges in a plurality of memory cells (or transistor units) serially connected by the same bit line may be lost due to being attracted by adjacent memory cells because the memory cells are close to one another. For example, in FIG. 5B, electrons in the transistor unit 522(i) may be attracted by the transistor unit 521(i) and/or the transistor unit 523(i) to move toward the transistor unit 521(i) and/or the transistor unit 523(i), which leads to reduction of a threshold voltage of the transistor unit 522(i), wherein 0<i<n+1, and i is an integer. If the aforementioned situation occurs to many transistor units in the PU 562, a threshold voltage distribution of the PU 562 may shift seriously. In this case, even though the PU 562 is read by using an optimal RVL corresponding to the PU 562 to obtain data stored in the PU 562, there is still high probability that the read data cannot be successfully decoded.

In the present exemplary embodiment, when data is to be read from memory cells (which are also referred to as second memory cells) belonging to a specific PU, a plurality of RVLs are used to read these memory cells and bit data with higher accuracy is selected from all the obtained bit data according to a usage state of memory cells (which are also referred to as first memory cells) of one or a plurality of PUs adjacent to the specific PU. Thereafter, the selected bit data is recombined as the new to-be-decoded data and then being decoded, thereby increasing a decoding success rate.

Figure 8:
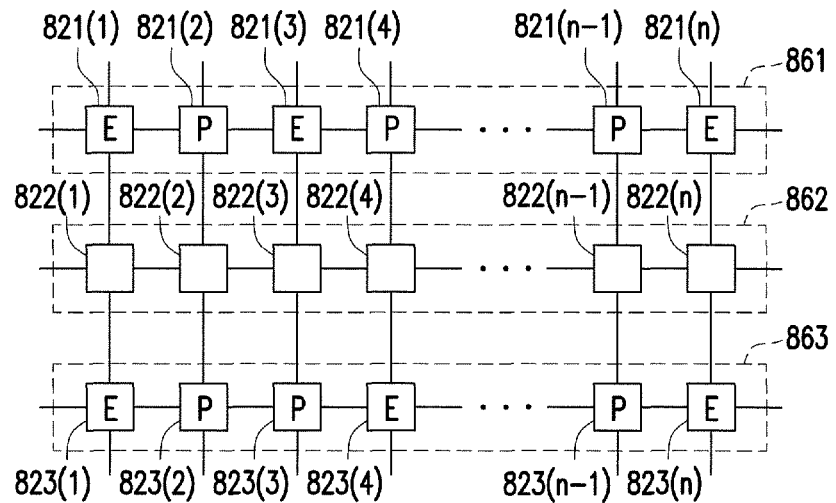
FIG. 8 is a schematic diagram illustrating a memory cell array and usage states of memory cells according to an exemplary embodiment of the disclosure.

FIG. 8 is a schematic diagram illustrating a memory cell array and usage states of memory cells according to an exemplary embodiment of the disclosure.

Referring to FIG. 8, a PU 861 includes memory cells 821(1) to 821(n), a PU 862 includes memory cells 822(1) to 822(n), and a PU 863 includes memory cells 823(1) to 823(n). For example, the memory cells 821(1) to 821(n) are used to represent the transistor units 521(1) to 521(n) illustrated in FIG. 5B, the memory cells 822(1) to 822(n) are used to represent the transistor units 522(1) to 522(n) illustrated in FIG. 5B, and the memory cells 823(1) to 823(n) are used to represent the transistor units 523(1) to 523(n) illustrated in FIG. 5B. In the present exemplary embodiment, it is assumed that the memory cells 821(1) to 821(n) are the first memory cells, and the memory cells 822(1) to 822(n) are the second memory cells.

In the present exemplary embodiment, the MMC 602 obtains usage state information of the memory cells 821(1) to 821(n) (i.e., the first memory cells). According to the usage state information of the memory cells 821(1) to 821(n), the MMC 602 sends a read command sequence (which is also referred to as a first read command sequence) to instruct the RNVM module 406 to read the memory cells 822(1) to 822(n) (i.e., the second memory cells) by using a RVL (which is also referred to as a first RVL) and sends another read command sequence (which is also referred to as a second read command sequence) to instruct the RNVM module 406 to read the memory cells 822(1) to 822(n) by using another RVL (which is also referred to as a second RVL). It should be noted that the first RVL is different from the second RVL.

Figure 9:
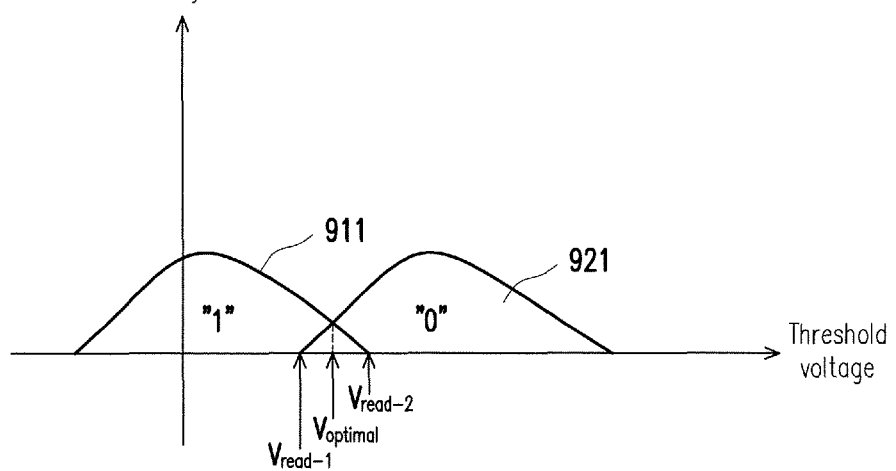
FIG. 9 is a schematic diagram illustrating threshold voltage distribution of the second memory cells according to an exemplary embodiment of the disclosure.

FIG. 9 is a schematic diagram illustrating threshold voltage distribution of the second memory cells according to an exemplary embodiment of the disclosure.

Referring to FIG. 9, states 911 and 921 represent threshold voltage distribution of the memory cells 822(1) to 822(n), a read voltage $V_{optimal}$ represents an optimal RVL corresponding to the memory cells 822(1) to 822(n), a read voltage $V_{read-1}$ represents the first RVL, and a read voltage $V_{read-2}$ represents the second RVL. In the present exemplary embodiment, the read voltage $V_{read-1}$ is lower than the read voltage $V_{optimal}$, and the read voltage $V_{read-2}$ is higher than the read voltage $V_{optimal}$. However, in an exemplary embodiment, the read voltage $V_{read-1}$ may also be higher than the read voltage $V_{optimal}$, and/or the read voltage $V_{read-2}$ may also be lower than the read voltage $V_{optimal}$. Alternatively, in an exemplary embodiment, one of the read voltage $V_{read-1}$ and the read voltage $V_{read-2}$ may also be the same as the read voltage $V_{optimal}$.

Referring back to FIG. 8, the usage state information of the memory cells 821(1) to 821(n) may present the usage state of at least one of the memory cells 821(1) to 821(n). For example, the usage state of a specific memory cell may be one of an erased state (which is marked as "E") and a programmed state (which is marked as "P"). For example, if a specific memory cell is erased, but not yet being programmed (e.g., the electrons are not yet injected into the memory cell by using a programming voltage), the memory cell is in the erased state. Alternatively, if a specific memory cell is programmed (e.g., the electrons are injected into the memory cell by using the programming voltage), but not yet being erased, the memory cell is in the programmed state. For example, in FIG. 9, if a threshold voltage of a specific memory cell belongs to the state 911, it indicates that a storage state of the memory cell is maintained in the erased state (e.g., the memory cell stores bit "1"). Otherwise, if a threshold voltage of a specific memory cell belongs to the state 921, it indicates that a storage state of the memory cell is switched to a programmed state (e.g., the memory cell stores bit "0") from the erased state.

In an exemplary embodiment, the MMC 602 may send at least one read command sequence (which is also referred to as at least one third read command sequence) to instruct the RNVM module 406 to read the memory cells 821(1) to 821(n) by using at least one RVL (which is also referred to at least one third RVL). By analyzing bit data obtained through reading the memory cells 821(1) to 821(n), the MMC 602 may obtain the usage state information of the memory cells 821(1) to 821(n) and record the information in a management table.

After obtaining the usage state information of the memory cells 821(1) to 821(n), the MMC 602 determines at least one candidate memory cell (which is also referred to as at least one first candidate memory cell) from the memory cells 822(1) to 822(n) according to at least one memory cell among the memory cells 821(1) to 821(n) which conforms to a specific usage state (which is also referred to as a first usage state). In addition, the MMC 602 determines another at least one candidate memory cell (which is also referred to as at least one second candidate memory cell) from the memory cells 822(1) to 822(n) according to at least one memory cell among the memory cells 821(1) to 821(n) which conforms to another usage state (which is also referred to as a second usage state). In the present exemplary embodiment, the first usage state is the erased state, and the second usage state is the programmed state. It should be noted that in the present exemplary embodiment, a total number of the second memory cells is equal to a sum of a total number of the first candidate memory cells and a total number of the second candidate memory cells.

For example, in FIG. 8, it is assumed that the memory cells which are in the erased state among the memory cells 821(1) to 821(n) include the memory cells 821(1), 821(3) and 821(n), and the memory cells which are in the programmed state among the memory cells 821(1) to 821(n) include the memory cells 821(2), 821(4) and 821(n-1). The MMC 602 determines the memory cells (e.g., the memory cells 822(1), 822(3) and 822(n)) among the memory cells 822(1) to 822(n) adjacent to the memory cells (e.g., the memory cells 821(1), 821(3) and 821(n)) which are in the erased state as the first candidate memory cells and determines the memory cells (e.g., the memory cells 822(2), 822(4) and 822(n-1)) among the memory cells 822(1) to 822(n) adjacent to the memory cells (e.g., memory cells 821(2), 821(4) and 821(n-1)) which are in the programmed state as the second candidate memory cells. In an exemplary embodiment, the adjacent memory cells refer to the memory cells serially connected by the same bit line and located at adjacent word line layers. For example, the memory cell 822(i) is adjacent to the memory cells 821(i) and 823(i).

From another aspect, according to the usage state information of the memory cells 821(1) to 821(n), the MMC 602 may divide the memory cells 822(1) to 822(n) into two categories. The memory cells of a first category (i.e., the first candidate memory cells) among the memory cells 822(1) to 822(n) are adjacent to the memory cells which are in the erased state among the memory cells 821(1) to 821(n), and thus, electrons in the memory cells of the first category (for example, the memory cell 822(1)) have a high probability to be lost due to being attracted by the memory cell in the erased state (for example, the memory cell 821(1)). By contrast, the memory cells of a second category (i.e., the second candidate memory cell) (for example, the memory cell 822(2)) among the memory cells 822(1) to 822(n) are adjacent to the memory cells in the programmed state (for example, the memory cell 821(2)) among the memory cells 821(1) to 821(n), and thus, the memory cells belonging to the second category are less easily lost.

In other words, in the same or similar usage condition, a degree of electron loss for the first candidate memory cells is higher than a degree of electron loss for the second candidate memory cells, such that the threshold voltages of the first candidate memory cells are lower than the threshold voltages of the second candidate memory cell in an overall aspect. Thus, with respect to the read voltage $V_{read-2}$ (or $V_{optimal}$), reading the first candidate memory cells by using the read voltage $V_{read-1}$ has a higher probability to obtain correct bits. In addition, with respect to the read voltage $V_{read-1}$ (or $V_{optimal}$), reading the second candidate memory cells by using the read voltage $V_{read-2}$ has a higher probability to obtain correct bits.

In an exemplary embodiment, bits (or all bits) obtained by reading the memory cells 822(1) to 822(n) by the first RVL (e.g., the read voltage $V_{read-1}$) are considered as first candidate bits, and bits (or all bits) obtained by reading the memory cells 822(1) to 822(n) by the second RVL (e.g., the read voltage $V_{read-2}$) are considered as second candidate bits. The MMC 602 determines at least one bit corresponding to the first candidate memory cell among the first candidate bits as at least one bit with higher accuracy (which is also referred to as at least one first bit) among the first candidate bits, and determines at least one bit corresponding to the second candidate memory cell among the second candidate bits as at least one bit with higher accuracy (which is also referred to as at least one second bit) among the second candidate bits. Taking the embodiment illustrated in FIG. 8 for example, the first bits includes bit data read from the memory cells 822(1), 822(3) and 822(n) by using the first RVL, and the second bits includes bit data read from the memory cells 822(2), 822(4) and 822(n-1) by using the second RVL. In other words, the first bits correspond to a storage state of a part (also referred to as a first part) of memory cells (i.e., the first candidate memory cells) among the memory cells 822(1) to 822(n), and the second bits correspond to a storage state of another part (also referred to as a second part) of memory cells (i.e., the second candidate memory cells) among the memory cells 822(1) to 822(n).

After the first bits and the second bits are obtained, the first bits and the second bits are combined as a plurality of bits (which are also referred to as third bits) to be decoded, and the ECCC 608 decodes the third bits. It should be noted that a total number of the third bits meets a data size of a decoding frame. A decoding frame is a basic data unit for the decoding operation performed by the ECCC 608. For example, the data size of a decoding frame may be equal to a data size of one or a plurality of PUs, which depends on a practice demand.

With respect to the bits (i.e., the first candidate bits) read by solely using the first RVL (e.g., the read voltage $V_{read-1}$), the bits (i.e., the second candidate bits) read by solely using the second RVL (e.g., the read voltage $V_{read-2}$) or the bits read by solely using the optimal RVL (e.g., the read voltage $V_{optimal}$) corresponding to the second memory cells, there is a smaller total number of error bits in the third bits. Thereby, the ECCC 608 has a higher probability of successfully decoding the bit data read from the memory cells 822(1) to 822(n).

Figure 10A:
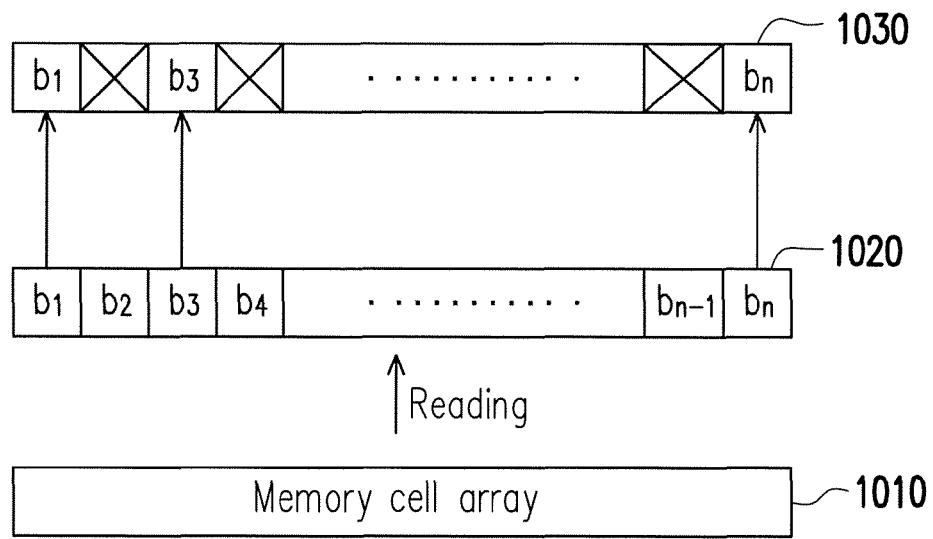
FIG. 10A and FIG. 10B are schematic diagrams illustrating the operation of obtaining the third bits according to an exemplary embodiment of the disclosure.
Figure 10B:
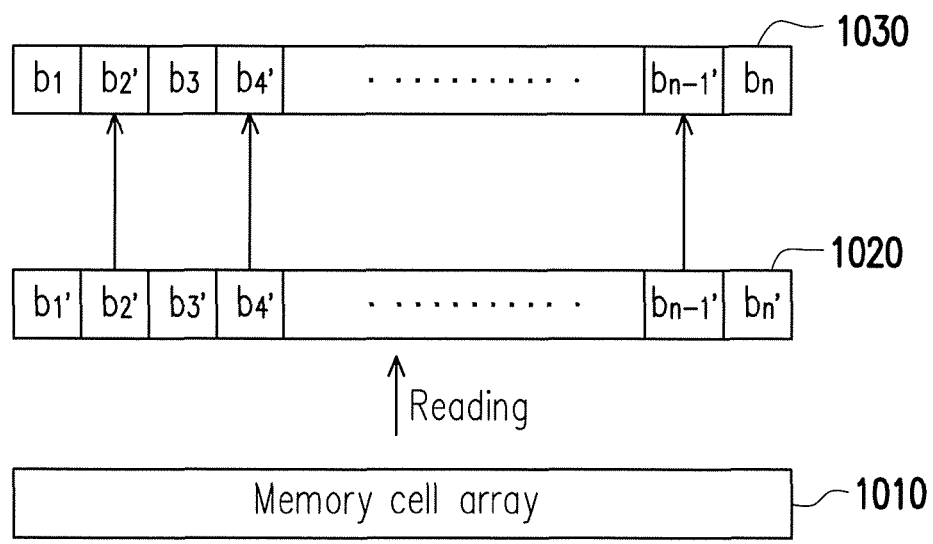

FIG. 10A and FIG. 10B are schematic diagrams illustrating the operation of obtaining the third bits according to an exemplary embodiment of the disclosure.

Referring to FIG. 8, FIG. 9 and FIG. 10A, according to the first read command sequence, the read voltage $V_{read-1}$ (i.e., the first RVL) is used to read the memory cells 822(1) to 822(n) in a memory cell array 1010 to obtain bits $b_1$ to $b_n$ (i.e., first candidate bits). Therein, the bit $b_i$ indicates a storage state of the memory cell 822(i) corresponding to the read voltage $V_{read-1}$. For example, if the bit $b_i$ is "1", it indicates that a threshold voltage of the memory cell 822(i) is less than the read voltage $V_{read-1}$; alternatively, if the bit $b_i$ is "0", it indicates the threshold voltage of the memory cell 822(i) is greater than the read voltage $V_{read-1}$. The bits $b_1$ to $b_n$ are temporarily stored in a buffer area 1020 (which is also referred to as a first buffer area).

In the present exemplary embodiment, the first read command sequence also contains information indicating which memory cells among the memory cells 822(1) to 822(n) are the first candidate memory cells and/or information indicating that the bit data corresponding to which memory cells has to be returned. According to the first read command sequence, the bit data (e.g., the bits $b_1$, $b_3$ and $b_n$) in the buffer area 1020 which corresponds to the first candidate memory cells (e.g., the memory cells 822(1), 822(3) and 822(n)) is considered as the first bits and transmitted to a buffer area 1030 (which is also referred to as a second buffer area). It should be noted that, according to the first read command sequence, the other bits (e.g., the bits $b_2$, $b_4$ and $b_{n-1}$) in the buffer area 1020 which do not belong to the first bits are not transmitted to the buffer area 1030.

Referring to FIG. 8, FIG. 9 and FIG. 10B, after the first bits are transmitted to the buffer area 1030, according to the second read command sequence, the read voltage $V_{read-2}$ (i.e., the second RVL) is used to read the memory cells 822(1) to 822(n) in the memory cell array 1010 to obtain bits $b_{1'}$, $b_{n'}$ (i.e., second candidate bits). The bit $b_{i'}$ indicates a storage state of the memory cell 822(i) corresponding to the read voltage $V_{read-2}$. For example, if the bit $b_{i'}$ "1", it indicates that the threshold voltage of the memory cell 822(i) is less than the read voltage $V_{read-2}$; alternatively, if the bit $b_{i'}$ is "0", it indicates that the threshold voltage of the memory cell 822(i) is greater than the read voltage $V_{read-2}$. The bits $b_{1'}$ to $b_{n'}$ are temporarily stored in the buffer area 1020. It should be noted that in the present exemplary embodiment, it is assumed that a data capacity of the buffer area 1020 is equal to a data capacity of one PU. Thus, in the buffer area 1020, the bits $b_1$ to $b_n$ are overwritten by the bits $b_{1'}$ to $b_{n'}$.

In the present exemplary embodiment, the second read command sequence also contains information indicating which memory cells among the memory cells 822(1) to 822(n) are the second candidate memory cells and/or information indicating that the bit data corresponding to which memory cells has to be returned. According to the second read command sequence, the bit data (e.g., the bits $b_{2'}$, $b_{4'}$ and $b_{n-1'}$) in the buffer area 1020 which correspond to the second candidate memory cells (e.g., the memory cells 822(2), 822(4) and 822(n-1)) is considered as the second bits and transmitted to the buffer area 1030. It should be noted that according to the second read command sequence, the other bits (e.g., the bits $b_{1'}$, $b_{3'}$ and $b_{n'}$) in the buffer area 1020 which do not belong to the second bits are not transmitted to the buffer area 1030.

After the second bits are transmitted to the buffer area 1030, the first bits and the second bits in the buffer area 1030 form third bits. For example, the third bits include the bits $b_1$, $b_{2'}$, $b_3$, $b_{4'}$, . . . , $b_{n-1'}$ and $b_n$. In the present exemplary embodiment, a total number of the third bits is equal to a sum of a total number of the first bits and a total number of the second bits. Then, the ECCC 608 may read the third bits from the buffer area 1030 and decode the third bits to attempt to correct errors contained therein. If the decoding successes, the ECCC 608 outputs the successfully decoded data. If the decoding fails, the ECCC 608 performs a next decoding operation or stops decoding.

It should be noted that in the present exemplary embodiment, the memory cell array 1010 and the buffer area 1020 are disposed in the RNVM module 406, and the buffer area 1030 is disposed in the MCCU 404. For example, the buffer area 1030 may be included in the buffer memory 610. However, in an exemplary embodiment, the buffer areas 1020 and 1030 may be disposed in the RNVM module 406. Alternatively, in an exemplary embodiment, the buffer areas 1020 and 1030 may be disposed in the MCCU 404 (e.g., the buffer memory 610).

Figure 11:
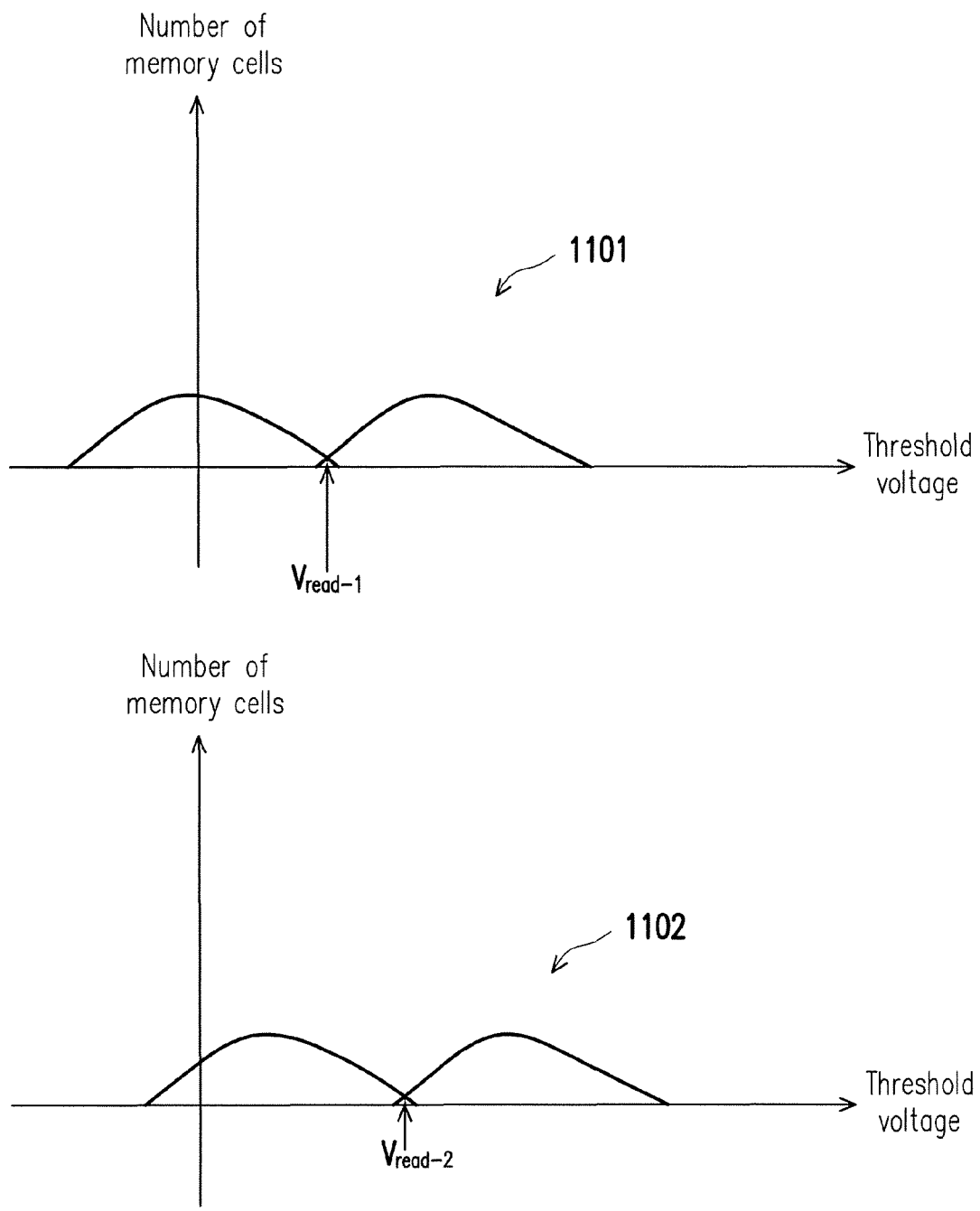
FIG. 11 is a schematic diagram illustrating threshold voltage distributions of the first candidate memory cells and the second candidate memory cells according to an exemplary embodiment of the disclosure.

FIG. 11 is schematic diagram illustrating threshold voltage distributions of the first candidate memory cells and the second candidate memory cells according to an exemplary embodiment of the disclosure.

Referring to FIG. 11, a distribution 1101 is used to represent a threshold voltage distribution of the first candidate memory cells among the second memory cells, and a distribution 1102 is used to represent a threshold voltage distribution of the second candidate memory cells among the second memory cells. As the electrons in the first candidate memory cells are more significantly lost due to being attracted by the adjacent memory cells, based on the same or similar usage condition, the threshold voltages of the first candidate memory cells in an overall aspect are lower than the threshold voltages of the second candidate memory cells. Thus, in correspondence to the threshold voltage distribution of the first candidate memory cells, reading the first candidate memory cells by using the read voltage $V_{read-1}$ may obtain the bit data (i.e., the first bits) with higher accuracy. In addition, in correspondence to the threshold voltage distribution of the second candidate memory cells, reading the second candidate memory cells by using the read voltage $V_{read-2}$ may obtain the bit data (i.e., the second bits) with higher accuracy. The read voltage $V_{read-1}$ is lower than the read voltage $V_{read-2}$.

In an exemplary embodiment, after determining the first candidate memory cells and the second candidate memory cells, the MMC 602 may further determine the first RVL according to the threshold voltage distribution of the first candidate memory cells and determine the second RVL according to the threshold voltage distribution of the second candidate memory cells. For example, in FIG. 11, the MMC 602 may obtain information related to the first candidate memory cells from the threshold voltage distribution of the second memory cells to obtain the distribution 1101 and perform the optimal read voltage tracking operation based on the distribution 1101 to obtain the read voltage $V_{read-1}$. Thereby, the determined read voltage $V_{read-1}$ is an optimal RVL corresponding to the first candidate memory cells. In addition, the MMC 602 may obtain information related to second candidate memory cells from the threshold voltage distribution of the second memory cells to obtain the distribution 1102 and perform the optimal read voltage tracking operation based on the distribution 1102 to obtain the read voltage $V_{read-2}$. Thereby, the determined read voltage $V_{read-2}$ is an optimal read voltage corresponding to the second candidate memory cells.

It should be noted that in the present exemplary embodiment illustrated in FIG. 8 described above, the memory cells 821(1) to 821(n) in the PU 861 are employed as the first memory cells, for example. However, in another exemplary embodiment of FIG. 8, the first memory cells may also refer to the memory cells 823(1) to 823(n) in the PU 863, and the related operations will not be repeatedly described. In addition, in another exemplary embodiment of FIG. 8, the first memory cells may also refer to the memory cells 821(1) to 821(n) in the PU 861 and the memory cells 823(1) to 823(n) in the PU 863. In this way, the data reading operation performed on a specific memory cell among the second memory cells may be performed based on the usage states of two adjacent memory cells thereof.

Referring to FIG. 8 again, in an exemplary embodiment, according to the usage state information of the memory cells 821(1) to 821(n) and the memory cells 823(1) to 823(n), each of the memory cells 822(1) to 822(n) may be identified as the first candidate memory cell or the second candidate memory cell. For example, if at least one of the memory cells 821(i) and 823(i) is in the erased state, the memory cell 822(i) may be identified as the first candidate memory cell. Otherwise, if both the memory cells 821(i) and 823(i) are in the programmed state, the memory cell 822(i) may be identified as the second candidate memory cell. Thus, the memory cells identified as the first candidate memory cells among the memory cells 822(1) to 822(n) include the memory cells 822(1), 822(3), 822(4) and 822(n), and the memory cells identified as the second candidate memory cells among the memory cells 822(1) to 822(n) include the memory cells 822(2) and 822(n-1).

Figure 12A:
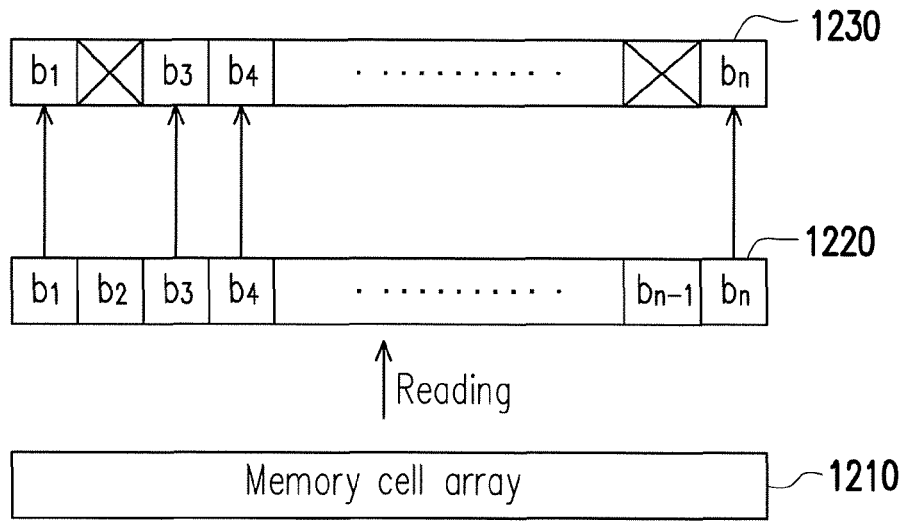
FIG. 12A and FIG. 12B are schematic diagrams illustrating the operation of obtaining the third bits according to another exemplary embodiment of the disclosure.
Figure 12B:
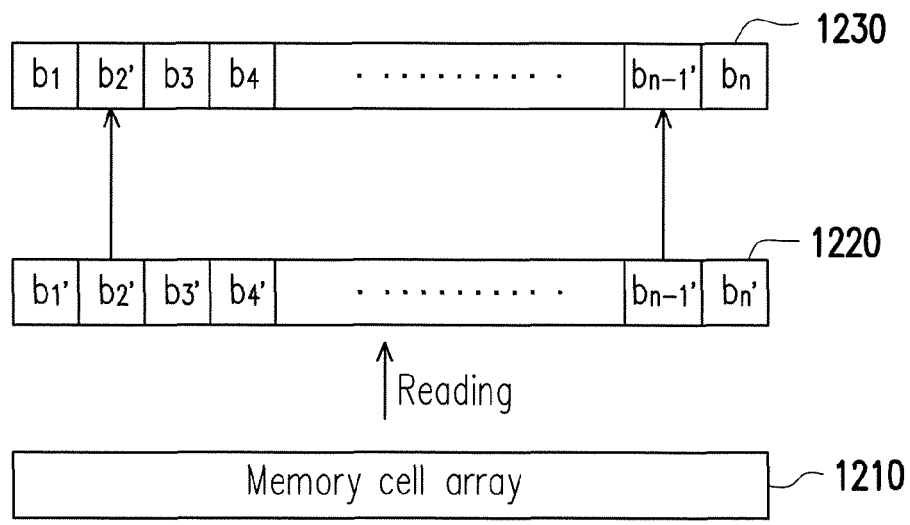

FIG. 12A and FIG. 12B are schematic diagrams illustrating the operation of obtaining the third bits according to another exemplary embodiment of the disclosure.

Referring to FIG. 8, FIG. 9 and FIG. 12A, in an exemplary embodiment, the MMC 602 sends the first read command sequence and the second read command sequence according to the usage state information of the memory cells 821(1) to 821(n) and the memory cells 823(1) to 823(n). According to the first read command sequence, the read voltage $V_{read-1}$ (i.e., the first RVL) is used to read the memory cells 822(1) to 822(n) in a memory cell array 1210 to obtain the bits $b_1$ to $b_n$ (i.e., the first candidate bits). The bits $b_1$ to $b_n$ are temporarily stored in a buffer area 1220 (i.e., a first buffer area). In addition, the first read command sequence also contains information indicating which memory cells among the memory cells 822(1) to 822(n) are the first candidate memory cells and/or information indicating that the bit data corresponding to which memory cells has to be returned. According to the first read command sequence, the bit data (e.g., the bits $b_1$, $b_3$, $b_4$ and $b_n$) in the buffer area 1220 which correspond to the first candidate memory cells (e.g., the memory cells 822(1), 822(3), 822(4) and 822(n)) is considered as the first bits and transmitted to a buffer area 1230 (i.e., the second buffer area).

Referring to FIG. 8, FIG. 9 and FIG. 12B, after the first bits are transmitted to the buffer area 1230, according to the second read command sequence, the read voltage $V_{read-2}$ (i.e., the second RVL) is used to read the memory cells 822(1) to 822(n) in the memory cell array 1210 to obtain the bits $b_{1'}$ to $b_{n'}$ (i.e., the second candidate bits). The bits $b_{1'}$ to $b_{n'}$ are temporarily stored in the buffer area 1220. In addition, the second read command sequence also contains information indicating which memory cells among the memory cells 822(1) to 822(n) are the second candidate memory cells and/or information indicating that the bit data corresponding to which memory cells has to be returned. According to the second read command sequence, the bit data (e.g., the bits $b_{2'}$ and $b_{n-1'}$) in the buffer area 1220 which correspond to the second candidate memory cells (e.g., the memory cells 822(2) and 822(n-1)) is considered as the second bits and transmitted to the buffer area 1230. Thereby, the ECCC 608 may read the third bits from the buffer area 1230 and decode the third bits.

It should be noted that in an exemplary embodiment of FIG. 8, the memory cell 821(3) adjacent to the memory cell 822(3) is in the erased state, but another memory cell 823(3) adjacent to the memory cell 822(3) is in the programmed state. Thus, even though electrons in the memory cell 822(3)

are easily lost due to being attracted by the memory cell 821(3), a degree of electron loss for the memory cell 822(3) is lower than a degree of electron loss of for memory cell 822(1) (electrons in the memory cells 822(1) are lost due to being attracted by two adjacent memory cells 821(1) and 823(1)). Similarly, the memory cell 823(4) adjacent to the memory cell 822(4) is in the erased state, but another memory cell 821(4) adjacent to the memory cell 822(4) is in the programmed state. Thus, even though electrons in the memory cell 822(4) are also easily lost due to being attracted by the memory cell 823(4), a degree of electron loss for the memory cell 822(4) is also lower than the degree of electron loss for the memory cell 822(1).

In an exemplary embodiment of FIG. 8, the memory cells 822(1) to 822(n) may be divided into three categories. The memory cells of a first category include the memory cell 822(1), and both two memory cells adjacent to the memory cell 822(1) are in the erased state. The memory cells of a second category include the memory cell 822(2), and both two memory cells adjacent to the memory cell 822(2) are in the programmed state. The memory cells of a third category include the memory cells 822(3) and 822(4) which are simultaneously adjacent the memory cells in the erased state and the memory cells in the programmed state. Thus, a degree of electron loss for the memory cells of the third category is between a degree of electron loss for the memory cells of the first category and a degree of electron loss for the memory cells of the second category. In an exemplary embodiment, if the memory cells of the first category are considered as the first candidate memory cells, and the memory cells of the second category are considered as the second candidate memory cells, the memory cells of the third category may be considered as other candidate memory cells (which are also referred to as third candidate memory cells).

In an exemplary embodiment of FIG. 8, according to the usage state information of the memory cells 821(1) to 821(n) and the memory cells 823(1) to 823(n), each of the memory cells 822(1) to 822(n) may be identified as the first candidate memory cell, the second candidate memory cell or the third candidate memory cell. For example, the first candidate memory cells among the memory cells 822(1) to 822(n) include the memory cells 822(1) and 822(n), the second candidate memory cells among the memory cells 822(1) to 822(n) include the memory cells 822(2) and 822(n-1), and the third candidate memory cells among the memory cells 822(1) to 822(n) includes the memory cells 822(3) and 822(4). It should be noted that in the present exemplary embodiment, a total number of the second memory cells is equal to the sum of the total number of the first candidate memory cells, the total number of the second candidate memory cell and the total number of the third candidate memory cells.

Figure 13:
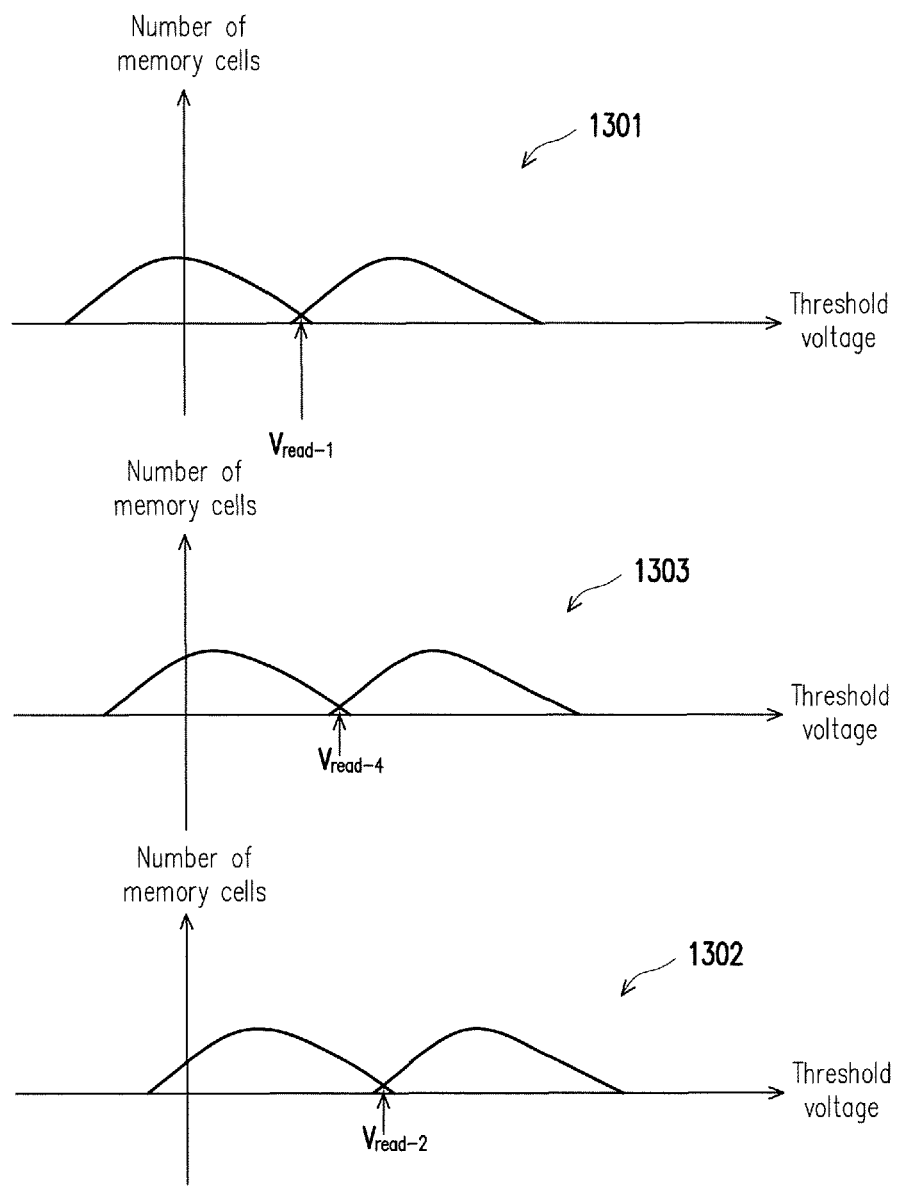
FIG. 13 is a schematic diagram illustrating threshold voltage distributions of the first candidate memory cells, the second candidate memory cells and the third candidate memory cells according to an exemplary embodiment of the disclosure.

FIG. 13 is a schematic diagram illustrating threshold voltage distributions of the first candidate memory cells, the second candidate memory cells and the third candidate memory cells according to an exemplary embodiment of the disclosure.

Referring to FIG. 8 and FIG. 13, a distribution 1301 is used to represent a threshold voltage distribution of the first candidate memory cells among the memory cells 822(1) to 822(n), a distribution 1302 is used to represent a threshold voltage distribution of the second candidate memory cells among the memory cells 822(1) to 822(n), and a distribution 1303 is used to represent a threshold voltage distribution of the third candidate memory cells among the memory cells 822(1) to 822(n). Overall, based on the same or similar usage condition, an (average) threshold voltage of the first candidate memory cells is the lowest, an (average) threshold voltage of the second candidate memory cells is the highest, and an (average) threshold voltage of the third candidate memory cells is between the (average) threshold voltage of the first candidate memory cells and the (average) threshold voltage of the second candidate memory cells.

In an exemplary embodiment, the MMC 602 may additionally determine a RVL (which is also referred to as a fourth RVL) and instruct the RNVM module 406 to read the memory cells 822(1) to 822(n) (i.e., the second memory cells) by using the fourth RVL to obtain at least one bit (which is also referred to as at least one fourth bit). It should be noted that the fourth RVL is between the first RVL and the second RVL. For example, in FIG. 13, if a read voltage $V_{read-4}$ is used to represent the fourth RVL, the read voltage $V_{read-4}$ is greater than the read voltage $V_{read-1}$, but less than the read voltage $V_{read-2}$. In addition, the at least one fourth bit corresponds a storage state of yet another part (which is also referred to as a third part) of memory cells among the second memory cells.

In correspondence to the threshold voltage distribution of the first candidate memory cells, reading the first candidate memory cells by using the read voltage $V_{read-1}$ may obtain the bit data (i.e., the first bits) with higher accuracy. In correspondence to the threshold voltage distribution of the second candidate memory cells, reading the second candidate memory cells by using the read voltage $V_{read-2}$ may obtain the bit data (i.e., the second bits) with higher accuracy. In correspondence to the threshold voltage distribution of the third candidate memory cells, reading the third candidate memory cells by using the read voltage $V_{read-4}$ may obtain bit data (i.e., fourth bits) with higher accuracy. In addition, the fourth RVL may be obtained according to the threshold voltage distribution of the third candidate memory cells or other parameters.

Figure 14A:
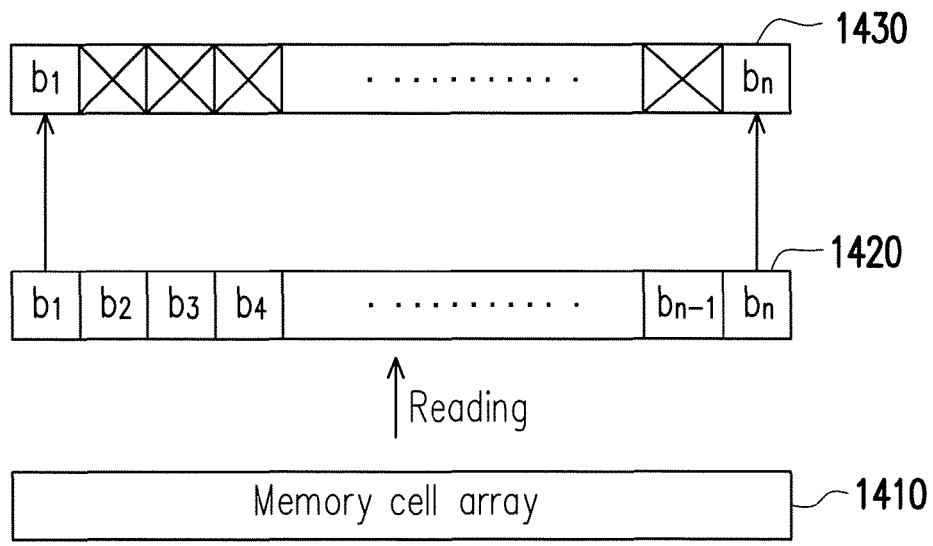
FIG. 14A to FIG. 14C are schematic diagrams illustrating the operation of obtaining the third bits according to another exemplary embodiment of the disclosure.
Figure 14B:
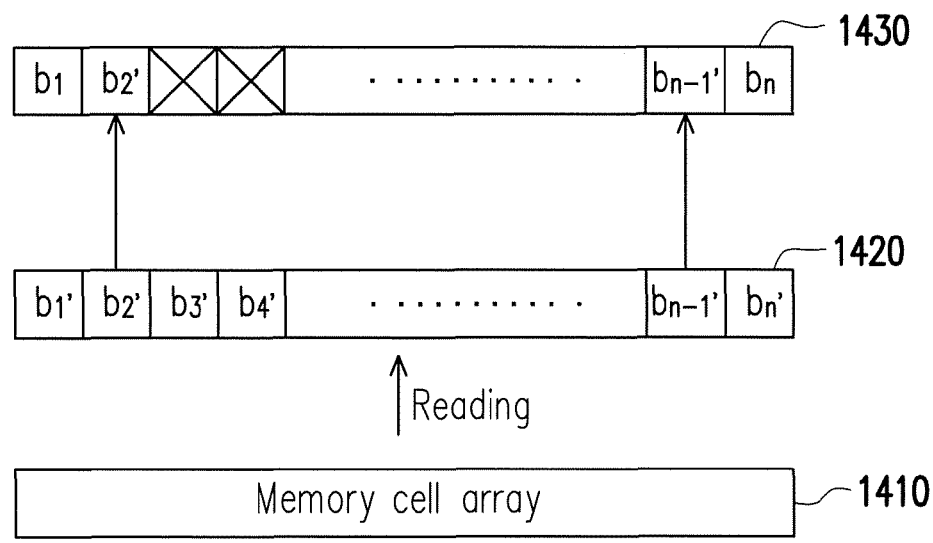
Figure 14C:
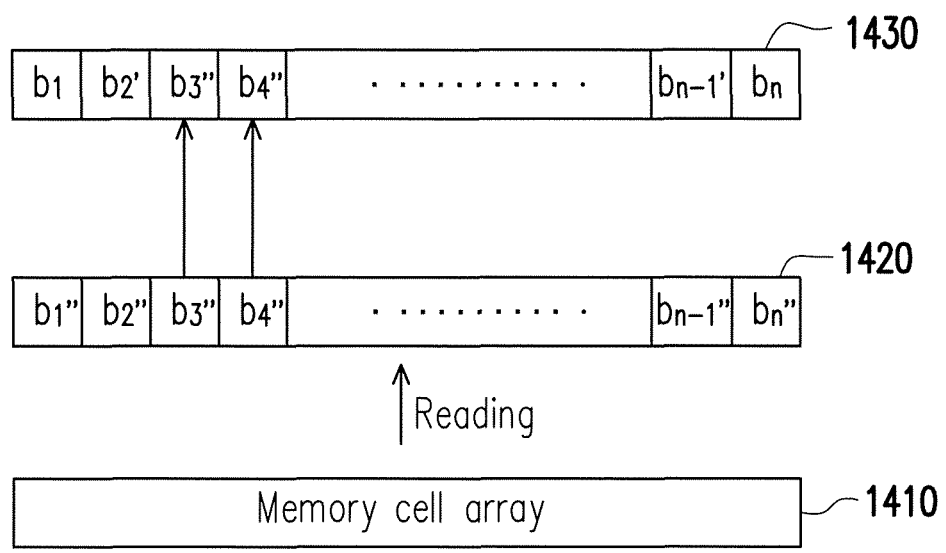

FIG. 14A to FIG. 14C are schematic diagrams illustrating the operation of obtaining the third bits according to another exemplary embodiment of the disclosure.

Referring to FIG. 8, FIG. 13 and FIG. 14A, in an exemplary embodiment, the MMC 602 sends the first read command sequence, the second read command sequence and another read command sequence (which is also referred to as a fourth read command sequence) according to the usage state information of the memory cells 821(1) to 821(n) and the memory cells 823(1) to 823(n). According to the first read command sequence, the read voltage $V_{read-1}$ (i.e., the first RVL) is used to read the memory cells 822(1) to 822(n) in a memory cell array 1410 to obtain the bits $b_1$ to $b_n$ (i.e., the first candidate bits). The bits $b_1$ to $b_n$ are temporarily stored in a buffer area 1420 (i.e., a first buffer area). In addition, the bit data (e.g., the bits $b_1$ and $b_n$) in the buffer area 1420 which correspond to the first candidate memory cells (e.g., the memory cells 822(1) and 822(n)) is considered as the first bits and transmitted to a buffer area 1430 (i.e., a second buffer area).

Referring to FIG. 8, FIG. 13 and FIG. 14B, after the first bits are transmitted to the buffer area 1430, according to the second read command sequence, the read voltage $V_{read-2}$ (i.e., the second RVL) is used to read the memory cells 822(1) to 822(n) in the memory cell array 1410 to obtain the bits $b_{1'}$ to $b_{n'}$ (i.e., the second candidate bits). The bits $b_{1'}$ to $b_{n'}$ are temporarily stored in the buffer area 1420. In addition, according to the second read command sequence, the bit data (e.g., the bits $b_{2'}$ and $b_{n-1'}$) in the buffer area 1420 which correspond to the second candidate memory cells (e.g., the memory cells 822(2) and 822(n-1)) is considered as the second bits and transmitted to the buffer area 1430.

Referring to FIG. 8, FIG. 13 and FIG. 14C, after the second bits are transmitted to the buffer area 1430, according to the fourth read command sequence, the read voltage $V_{read-4}$ (i.e., the fourth RVL) is used to read the memory cells 822(1) to 822(n) in the memory cell array 1410 to obtain bits $b_{1'''}$ to $b_{n'''}$ (which are also referred to as third candidate bits). The bits $b_{1'''}$ to $b_{n'''}$ are temporarily stored in the buffer area 1420. In addition, the fourth read command sequence also contains information indicating which memory cells among the memory cells 822(1) to 822(n) are the third candidate memory cells and/or information indicating that the bit data corresponding to which memory cells has to be returned. Thus, according to the fourth read command sequence, the bit data (e.g., bits $b_{3'''}$ and $b_{4'''}$) in the buffer area 1420 which correspond to the third candidate memory cells (e.g., the memory cells 822(3) and 822(4)) is considered as the fourth bits and transmitted to the buffer area 1430. The first bits, the second bits and the fourth bits form the third bits in the buffer area 1430. For example, the third bits include the bits $b_1$, $b_{2'}$, $b_{3'''}$, $b_{4'''}$, ..., $b_{n-1}$, and $b_n$. In the present exemplary embodiment, a total number of the third bits is equal to a sum of the total number of the first bit, the total number of the second bits and a total number of the fourth bits. Thereby, the ECCC 608 may read the third bits from the buffer area 1430 and decode the third bits.

It should be noted that in the present exemplary embodiments set forth above, the sequence of reading the first bits (or the first candidate bits), the second bits (or the second candidate bits) and the fourth bits (or the third candidate bits) may be dynamically adjusted. For example, in an exemplary embodiment, the first candidate bits may be first read to obtain the first bits, the third candidate bits may be then read to obtain the fourth bits, and the second candidate bits may be finally read to obtain the second bits. Alternatively, in an exemplary embodiment, the second candidate bits may be first read to obtain the second bits, and the first candidate bits may be then read to obtain the first bits.

Figure 15:
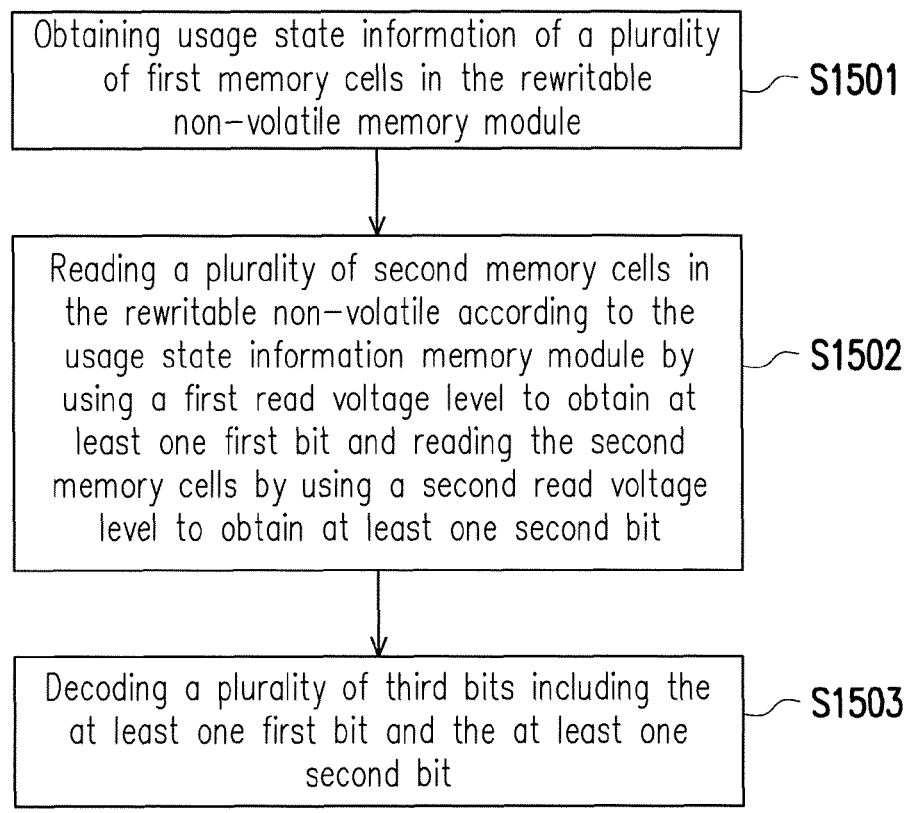
FIG. 15 is a flowchart illustrating a decoding method according to an exemplary embodiment of the disclosure.

FIG. 15 is a flowchart illustrating a decoding method according to an exemplary embodiment of the disclosure.

Referring to FIG. 15, in step S1501, usage state information of a plurality of first memory cells in a RNVM module is obtained. In step S1502, according to the usage state information, a plurality of second memory cells in the RNVM module are read by using a first RVL to obtain at least one first bit, and the second memory cells are read by using a second RVL to obtain the at least one second bit. The at least one first bit corresponds to a storage state of a first part of memory cells among the second memory cells, the at least one second bit corresponds to a storage state of a second part of memory cells among the second memory cells, and the first RVL is different from the second RVL. In step S1503, a plurality of third bits including the at least one first bit and the at least one second bit are decoded.

Nevertheless, steps depicted in FIG. 15 are described in detail as above, thus related description is omitted hereinafter. It should be noted that, the steps depicted in FIG. 15 may be implemented as a plurality of program codes or circuits, and the disclosure is not limited thereto. Moreover, the method disclosed in FIG. 15 may be implemented with reference to above embodiments, or may be implemented separately, the disclosure is not limited thereto.

In summary, when data is to be read from the second memory cells, a plurality of RVLs are used to read these second memory cells according to the usage state of the first memory cells, so as to obtain the first bits and the second bits with higher accuracy, wherein the first bits correspond to the storage state of a part of memory cells among the second memory cells, and the second bits correspond to the storage state of another part of memory cells among the second memory cells. Afterwards, the third bits including the first bits and the second bits can be decoded, so as to increase the decoding success rate. Moreover, in the disclosure, among the second memory cells, a memory cell simultaneously adjacent to multiple memory cells in the erased state, a memory cell simultaneously adjacent to multiple memory cells in the programmed state, and a memory cell adjacent to (only) one single memory cell in the erased state (or in the programmed state) can be distinguished, and accordingly, the corresponding RVLs can be used to read these memory cells, so as to obtain the corresponding data bits, and thereby reducing the errors in the data to be decoded. The previously described exemplary embodiments of the disclosure have the advantages aforementioned, wherein the advantages aforementioned not required in all versions of the disclosure.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A decoding method, for a rewritable non-volatile memory module comprising a plurality of memory cells, the decoding method comprising:
   obtaining usage state information of a plurality of first memory cells among the memory cells;
   reading a plurality of second memory cells among the memory cells by using a first read voltage level to obtain at least one first bit and reading the second memory cells by using a second read voltage level to obtain at least one second bit according to the usage state information, wherein the at least one first bit corresponds to a storage state of a first part of memory cells among the second memory cells, the at least one second bit corresponds to a storage state of a second part of memory cells among the second memory cells, and the first read voltage level is different from the second read voltage level; and
   decoding a plurality of third bits comprising the at least one first bit and the at least one second bit.

2. The decoding method according to claim 1, wherein the step of obtaining the usage state information of the first memory cells among the memory cells comprises:
   reading the first memory cells by using at least one third read voltage level to obtain the usage state information of the first memory cells.

3. The decoding method according to claim 1, wherein the step of reading the second memory cells among the memory cells by using first read voltage level to obtain the at least one first bit and reading the second memory cells by using the second read voltage level to obtain the at least one second bit according to the usage state information comprises:
   reading the second memory cells by using the first read voltage level to obtain a plurality of first candidate bits;
   reading the second memory cells by using the second read voltage level to obtain a plurality of second candidate bits; and obtaining the at least one first bit from the first candidate bits and obtaining the at least one second bit from the second candidate bits according to the usage state information.

4. The decoding method according to claim 3, wherein the step of obtaining the at least one first bit from the first candidate bits and obtaining the at least one second bit from the second candidate bits according to the usage state information comprises:
determining at least one first candidate memory cell from the second memory cells according to at least one memory cell which conforms to a first usage state among the first memory cells;
determining at least one second candidate memory cell from the second memory cells according to at least one memory cell which conforms to a second usage state among the first memory cells; and
determining at least one bit which corresponds to the at least one first candidate memory cell among the first candidate bits as the at least one first bit and determining at least one bit which corresponds to the at least one second candidate memory cell among the second candidate bits as the at least one second bit.

5. The decoding method according to claim 4, wherein the at least one first candidate memory cell is adjacent to the at least one memory cell which conforms to the first usage state, and the at least one second candidate memory cell is adjacent to the at least one memory cell which conforms to the second usage state.

6. The decoding method according to claim 4, wherein the first usage state is an erased state, and the second usage state is a programmed state.

7. The decoding method according to claim 4, further comprising:
determining the first read voltage level according to a threshold voltage distribution of the at least one first candidate memory cell; and
determining the second read voltage level according to a threshold voltage distribution of the at least one second candidate memory cell.

8. The decoding method according to claim 3, wherein the step of reading the second memory cells among the memory cells by using the first read voltage level to obtain the at least one first bit and reading the second memory cells by using the second read voltage level to obtain the at least one second bit according to the usage state information further comprises:
storing the first candidate bits in a first buffer area temporarily;
reading the at least one first bit from the first buffer area storing the first candidate bits and transmitting the at least one first bit to a second buffer area;
storing the second candidate bits in the first buffer area temporarily; and
reading the at least one second bit from the first buffer area storing the second candidate bits and transmitting the at least one second bit to the second buffer area,
wherein the at least one first bit and the at least one second bit form the third bits in the second buffer area.

9. The decoding method according to claim 1, wherein the rewritable non-volatile memory module comprises a plurality of word line layers disposed in stack arrangement, the first memory cells are disposed at a first word line layer among the word line layers, the second memory cells are disposed at a second word line layer among the word line layers, and the first word line layer is adjacent to the second word line layer.

10. The decoding method according to claim 1, wherein the third bits further comprise at least one fourth bit corresponding to a storage state of a third part of memory cells among the second memory cells,
wherein the decoding method further comprises:
reading the second memory cells by using a fourth read voltage level to obtain the at least one fourth bit according to the usage state information,
wherein the fourth read voltage level is between the first read voltage level and the second read voltage level.

11. A memory storage device, comprising:
a connection interface unit, configured to couple to a host system;
a rewritable non-volatile memory module, comprising a plurality of memory cells; and
a memory control circuit unit, coupled to the connection interface unit and the rewritable non-volatile memory module,
wherein the memory control circuit unit is configured to obtain usage state information of a plurality of first memory cells among the memory cells,
wherein the memory control circuit unit is further configured to send a first read command sequence to instruct to read a plurality of second memory cells among the memory cells by using a first read voltage level to obtain at least one first bit and send a second read command sequence to instruct to read the second memory cells by using a second read voltage level to obtain at least one second bit according to the usage state information, wherein the at least one first bit corresponds to a storage state of a first part of memory cells among the second memory cells, the at least one second bit corresponds to a storage state of a second part of memory cells among the second memory cells, and the first read voltage level is different from the second read voltage level,
wherein the memory control circuit unit is further configured to decode a plurality of third bits comprising the at least one first bit and the at least one second bit.

12. The memory storage device according to claim 11, wherein the configured operation of the memory control circuit unit obtaining the usage state information of the first memory cells among the memory cells comprises:
sending a third read command sequence to instruct to read the first memory cells by using at least one third read voltage level to obtain the usage state information of the first memory cells.

13. The memory storage device according to claim 11, wherein the first read command sequence is configured to instruct to read the second memory cells by using the first read voltage level to obtain a plurality of first candidate bits,
wherein the second read command sequence is configured to instruct to read the second memory cells by using the second read voltage level to obtain a plurality of second candidate bits,
wherein the configured operation of the memory control circuit unit obtaining the at least one first bit and the at least one second bit comprises:
obtaining the at least one first bit from the first candidate bits and obtaining the at least one second bit from the second candidate bits according to the usage state information.

14. The memory storage device according to claim 13, wherein the configured operation of the memory control circuit unit obtaining the at least one first bit from the first candidate bits and obtaining the at least one second bit from the second candidate bits according to the usage state information comprises:

determining at least one first candidate memory cell from the second memory cells according to at least one memory cell which conforms to a first usage state among the first memory cells;

determining at least one second candidate memory cell from the second memory cells according to at least one memory cell which conforms to a second usage state among the first memory cells; and determining at least one bit which corresponds to the at least one first candidate memory cell among the first candidate bits as the at least one first bit and determining at least one bit which corresponds to the at least one second candidate memory cell among the second candidate bits as the at least one second bit.

15. The memory storage device according to claim 14, wherein the at least one first candidate memory cell is adjacent to the at least one memory cell which conforms to the first usage state, and the at least one second candidate memory cell is adjacent to the at least one memory cell which conform to the second usage state.

16. The memory storage device according to claim 14, wherein the first usage state is an erased state, and the second usage state is a programmed state.

17. The memory storage device according to claim 14, wherein the memory control circuit unit is further configured to determine the first read voltage level according to a threshold voltage distribution of the at least one first candidate memory cell, wherein the memory control circuit unit is further configured to determine the second read voltage level according to a threshold voltage distribution of the at least one second candidate memory cell.

18. The memory storage device according to claim 13, wherein the configured operation of the memory control circuit unit obtaining the at least one first bit and the at least one second bit further comprises:

storing the first candidate bits in a first buffer area temporarily;

reading the at least one first bit from the first buffer area storing the first candidate bits and transmitting the at least one first bit to a second buffer area;

storing the second candidate bits in the first buffer area temporarily; and reading the at least one second bit from the first buffer area storing the second candidate bits and transmitting the at least one second bit to the second buffer area, wherein the at least one first bit and the at least one second bit form the third bits in the second buffer area.

19. The memory storage device according to claim 11, wherein the rewritable non-volatile memory module comprises a plurality of word line layers disposed in stack arrangement, the first memory cells are disposed at a first word line layer among the word line layers, the second memory cells are disposed at a second word line layer among the word line layers, and the first word line layer is adjacent to the second word line layer.

20. The memory storage device according to claim 11, wherein the third bits further comprise at least one fourth bit corresponding to a storage state of a third part of memory cells among the second memory cells, wherein the memory control circuit unit is further configured to send a fourth read command sequence according to the usage state information to instruct to read the second memory cells by using a fourth read voltage level to obtain the at least one fourth bit, wherein the fourth read voltage level is between the first read voltage level and the second read voltage level.

21. A memory control circuit unit, for controlling a rewritable non-volatile memory module comprising a plurality of memory cells, the memory control circuit unit comprises;

a host interface, configured to couple to a host system;

a memory interface, configured to couple to the rewritable non-volatile memory module;

an error checking and correcting circuit; and a memory management circuit, coupled to the host interface, the memory interface and the error checking and correcting circuit, wherein the memory management circuit is configured to obtain usage state information of a plurality of first memory cells among the memory cells, wherein the memory management circuit is further configured to send a first read command sequence to instruct to read a plurality of second memory cells among the memory cells by using a first read voltage level to obtain at least one first bit and send a second read command sequence to instruct to read the second memory cells by using a second read voltage level to obtain at least one second bit according to the usage state information, wherein the at least one first bit corresponds to a storage state of a first part of memory cells among the second memory cells, the at least one second bit corresponds to a storage state of a second part of memory cells among the second memory cells, and the first read voltage level is different from the second read voltage level, wherein the error checking and correcting circuit is configured to decode a plurality of third bits comprising the at least one first bit and the at least one second bit.

22. The memory control circuit unit according to claim 21, wherein the configured operation of the memory management circuit obtaining the usage state information of the first memory cells among the memory cells comprises:

sending a third read command sequence to instruct to read the first memory cells by using at least one third read voltage level to obtain the usage state information of the first memory cells.

23. The memory control circuit unit according to claim 21, wherein the first read command sequence is configured to instruct to read the second memory cells by using the first read voltage level to obtain a plurality of first candidate bits, wherein the second read command sequence is configured to instruct to read the second memory cells by using the second read voltage level to obtain a plurality of second candidate bits, wherein the configured operation of the memory management circuit obtaining the at least one first bit and the at least one second bit comprises:

obtaining the at least one first bit from the first candidate bits and obtaining the at least one second bit from the second candidate bits according to the usage state information.

24. The memory control circuit unit according to claim 23, wherein the configured operation of the memory management circuit obtaining the at least one first bit from the first candidate bits and obtaining the at least one second bit from the second candidate bits according to the usage state information comprises:

determining at least one first candidate memory cell from the second memory cells according to at least one memory cell which conforms to a first usage state among the first memory cells;

determining at least one second candidate memory cell from the second memory cells according to at least one memory cell which conforms to a second usage state among the first memory cells; and determining at least one bit which corresponds to the at least one first candidate memory cell among the first candidate bits as the at least one first bit and determining at least one bit which corresponds to the at least one second candidate memory cell among the second candidate bits as the at least one second bit.

25. The memory control circuit unit according to claim 24, wherein the at least one first candidate memory cell is adjacent to the at least one memory cell which conforms to the first usage state, and the at least one second candidate memory cell is adjacent to the at least one memory cell which conforms to the second usage state.

26. The memory control circuit unit according to claim 24, wherein the first usage state is an erased state, and the second usage state is a programmed state.

27. The memory control circuit unit according to claim 24, wherein the memory management circuit is further configured to determine the first read voltage level according to a threshold voltage distribution of the at least one first candidate memory cell; and wherein the memory management circuit is further configured to determine the second read voltage level according to a threshold voltage distribution of the at least one second candidate memory cell.

28. The memory control circuit unit according to claim 23, wherein the configured operation of the memory management circuit obtaining the at least one first bit and the at least one second bit further comprises:

storing the first candidate bits in a first buffer area temporarily;

reading the at least one first bit from the first buffer area storing the first candidate bits and transmitting the at least one first bit to a second buffer area;

storing the second candidate bits in the first buffer area temporarily; and reading the at least one second bit from the first buffer area storing the second candidate bits and transmitting the at least one second bit to the second buffer area, wherein the at least one first bit and the at least one second bit form the third bits in the second buffer area.

29. The memory control circuit unit according to claim 21, wherein the rewritable non-volatile memory module comprises a plurality of word line layers disposed in stack arrangement, the first memory cells are disposed at a first word line layer among the word line layers, the second memory cells are disposed at a second word line layer among the word line layers, and the first word line layer is adjacent to the second word line layer.

30. The memory control circuit unit according to claim 21, wherein the third bits further comprise at least one fourth bit corresponding to a storage state of a third part of memory cells among the second memory cells, wherein the memory management circuit is further configured to send a fourth read command sequence according to the usage state information to instruct to read the second memory cells by using a fourth read voltage level to obtain the at least one fourth bit, wherein the fourth read voltage level is between the first read voltage level and the second read voltage level.

* * * * *